United States Patent [19]

Shibata et al.

[11] Patent Number: 5,063,449
[45] Date of Patent: Nov. 5, 1991

[54] SOLID-STATE IMAGE SENSOR EMPLOYING A GATE AND DIODE FOR BIAS CHARGE INJECTION

[75] Inventors: Hidenori Shibata, Yokohama; Ikuko Inoue, Kawasaki; Nozomu Harada, Yokohama, all of Japan

[73] Assignee: Kabushiki Kaisha Toshiba, Kawasaki, Japan

[21] Appl. No.: 437,260

[22] Filed: Nov. 16, 1989

[30] Foreign Application Priority Data

Nov. 18, 1988 [JP] Japan ................. 63-290148
Jan. 25, 1989 [JP] Japan ..................... 1-15511
Oct. 16, 1989 [JP] Japan ................... 1-266160

[51] Int. Cl.$^5$ .................. H04N 3/14; H04N 5/335
[52] U.S. Cl. ................ 358/213.11; 358/213.31; 358/213.26; 358/213.23
[58] Field of Search ............... 358/213.11, 213.13, 358/213.22, 213.23, 213.26, 213.27, 213.29, 213.31

[56] References Cited

U.S. PATENT DOCUMENTS

| | | | |
|---|---|---|---|
| 4,809,073 | 2/1989 | Chiba et al. | 358/213.13 |
| 4,845,375 | 7/1989 | Tsushima | 358/213.11 |
| 4,908,518 | 3/1990 | Losee et al. | 358/213.23 |
| 4,912,560 | 3/1990 | Osawa et al. | 358/213.31 |

FOREIGN PATENT DOCUMENTS 3741963 6/1988 Fed. Rep. of Germany .

OTHER PUBLICATIONS

A High Resolution Staggered-Configuration CCD Imager Overlaid with an a-Si:H Photoconductive Layer; Nozumu Harada et al.; IEEE Trans Electron Device vol. 32, No. 8; Aug. 1985.

*Primary Examiner*—John K. Peng
*Assistant Examiner*—Tuan V. Ho
*Attorney, Agent, or Firm*—Oblon, Spivak, McClelland, Maier & Neustadt

[57] ABSTRACT

A solid-state image sensor comprises signal charge storage diodes formed in a semiconductor substrate, a plurality of signal charge read-out sections formed adjacent to the signal charge storage diodes on the semiconductor substrate, a plurality of signal charge transfer sections formed close to the signal charge read-out sections on the semiconductor substrate, pixel electrodes electrically coupled to the signal charge storage diodes, and a plurality of bias-charge injecting gates and bias-charge injecting diodes, which are provided adjacent to the signal charge transfer sections to inject bias charges into the signal charge storage diodes via the signal charge read-out sections.

15 Claims, 24 Drawing Sheets

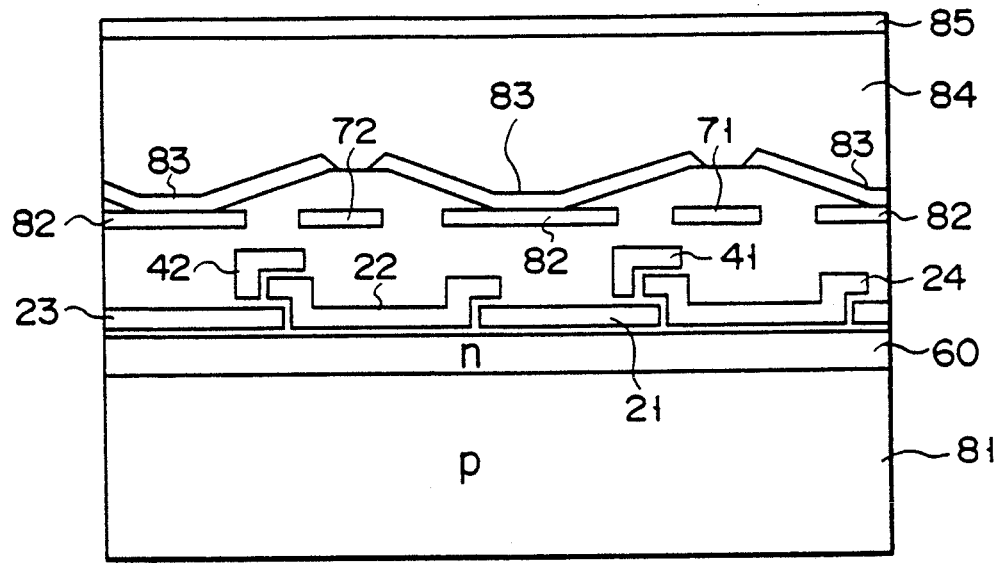
F I G. 2 B
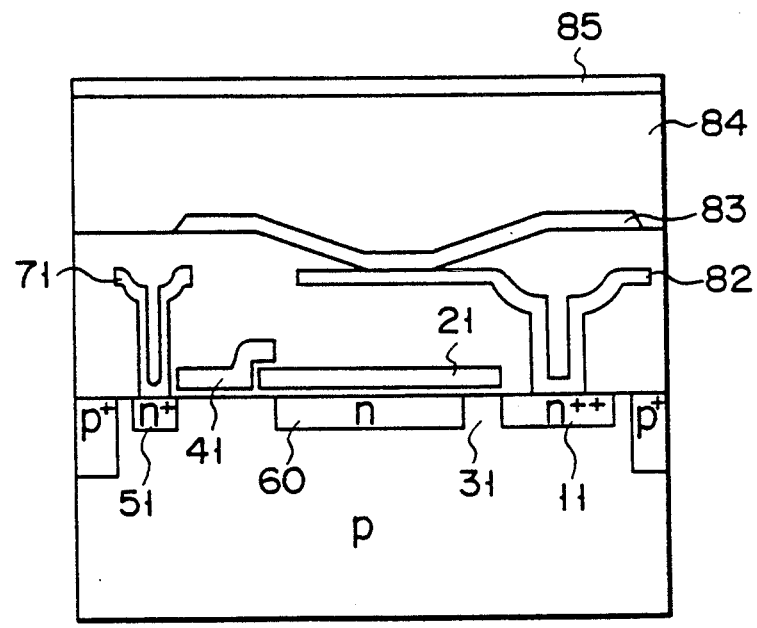
F I G. 2 C

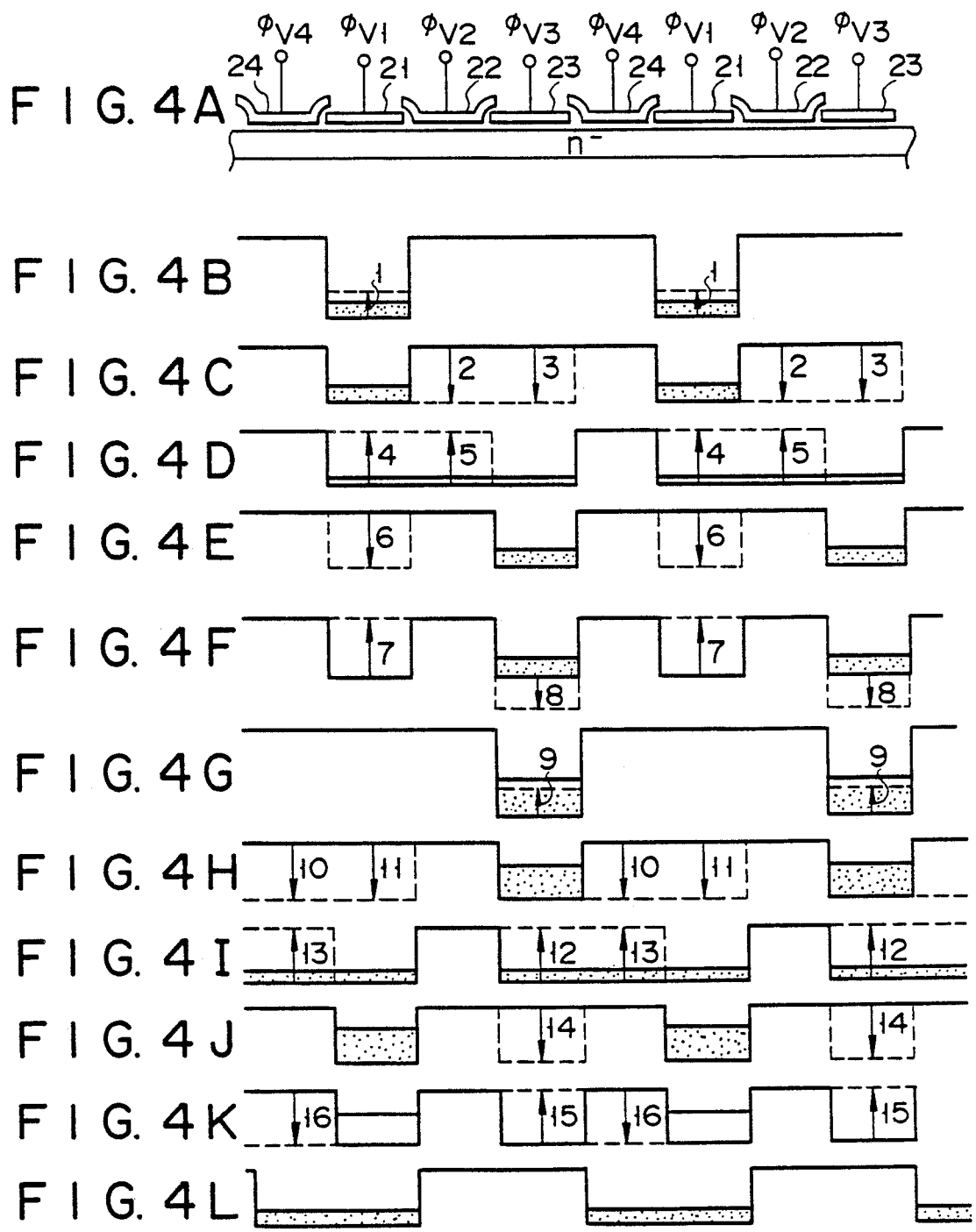

F I G. 9A 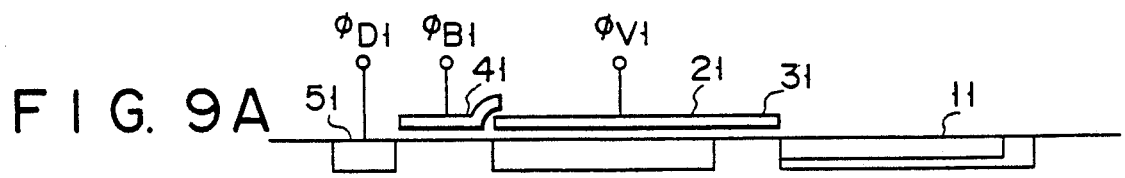
F I G. 9B 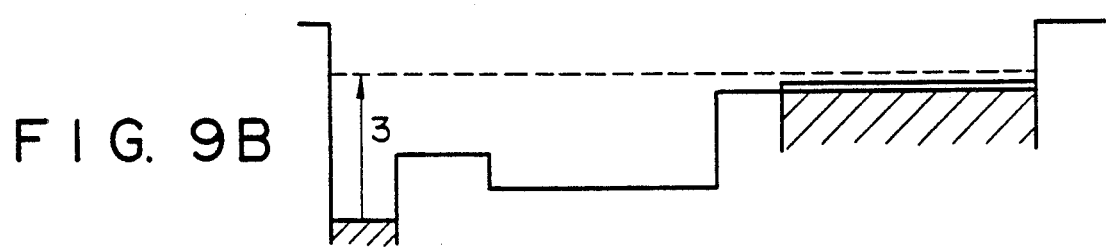
F I G. 9C 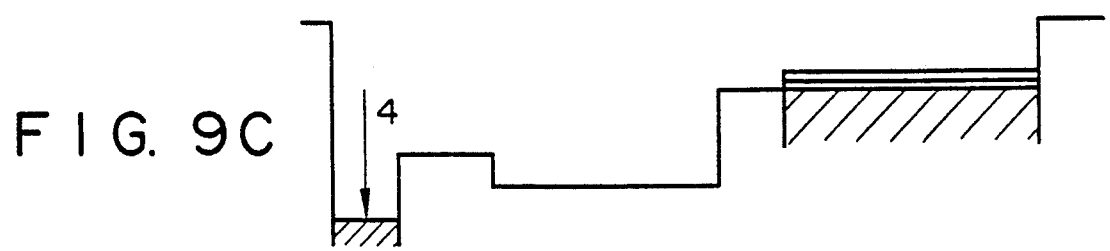
F I G. 9D 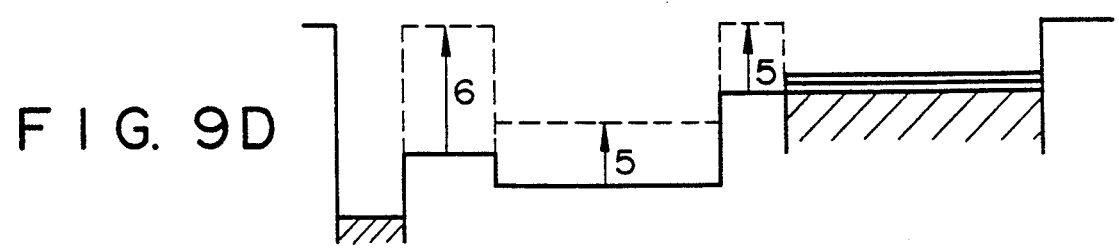
F I G. 9E 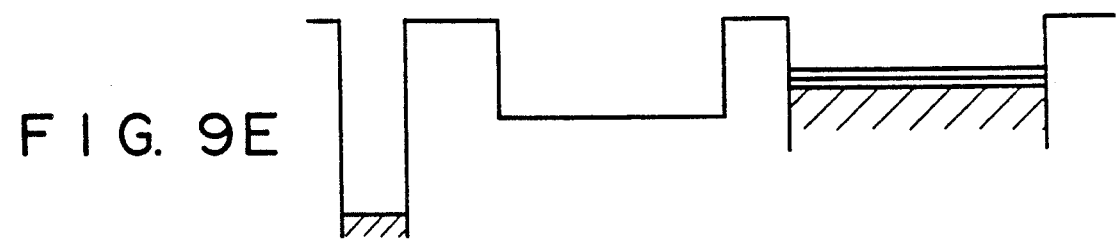

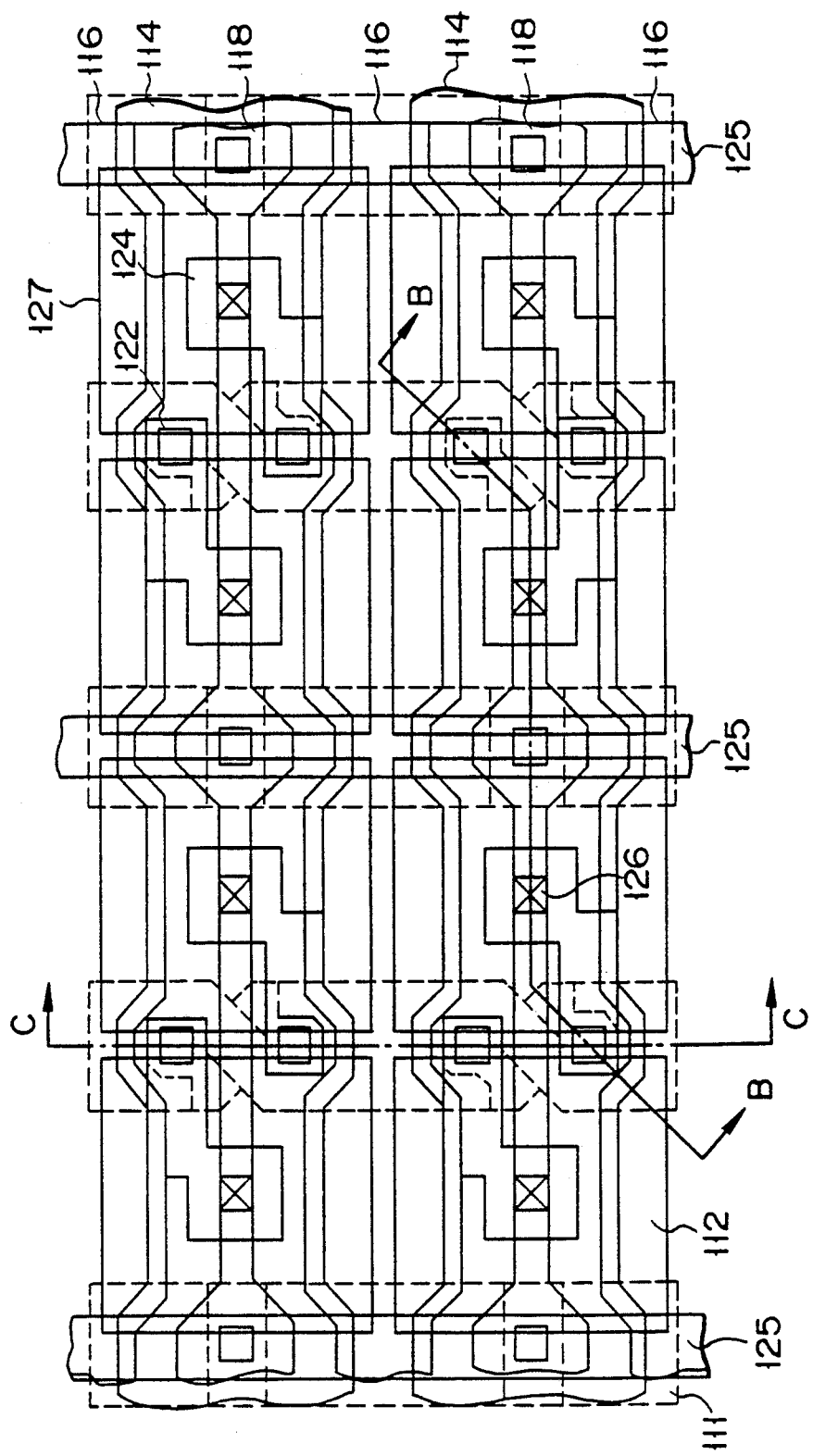
F I G. 12A

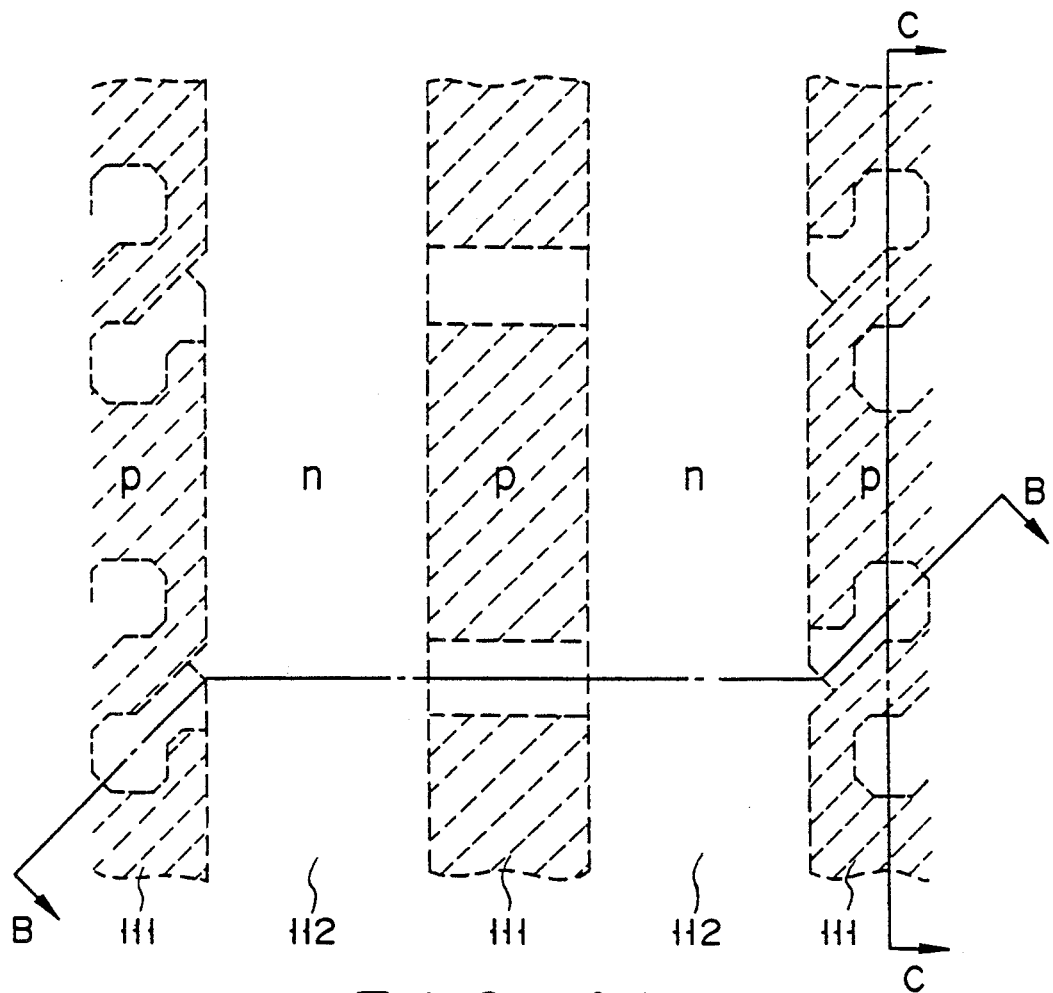
F I G. 14A
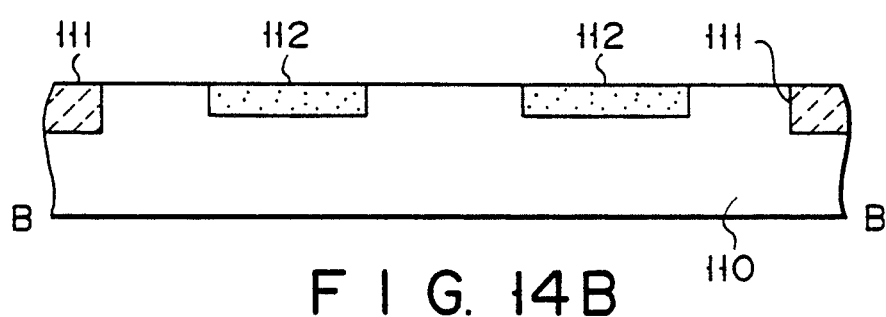
F I G. 14B
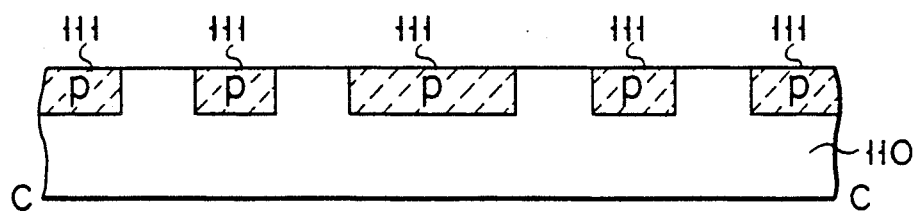
F I G. 14C

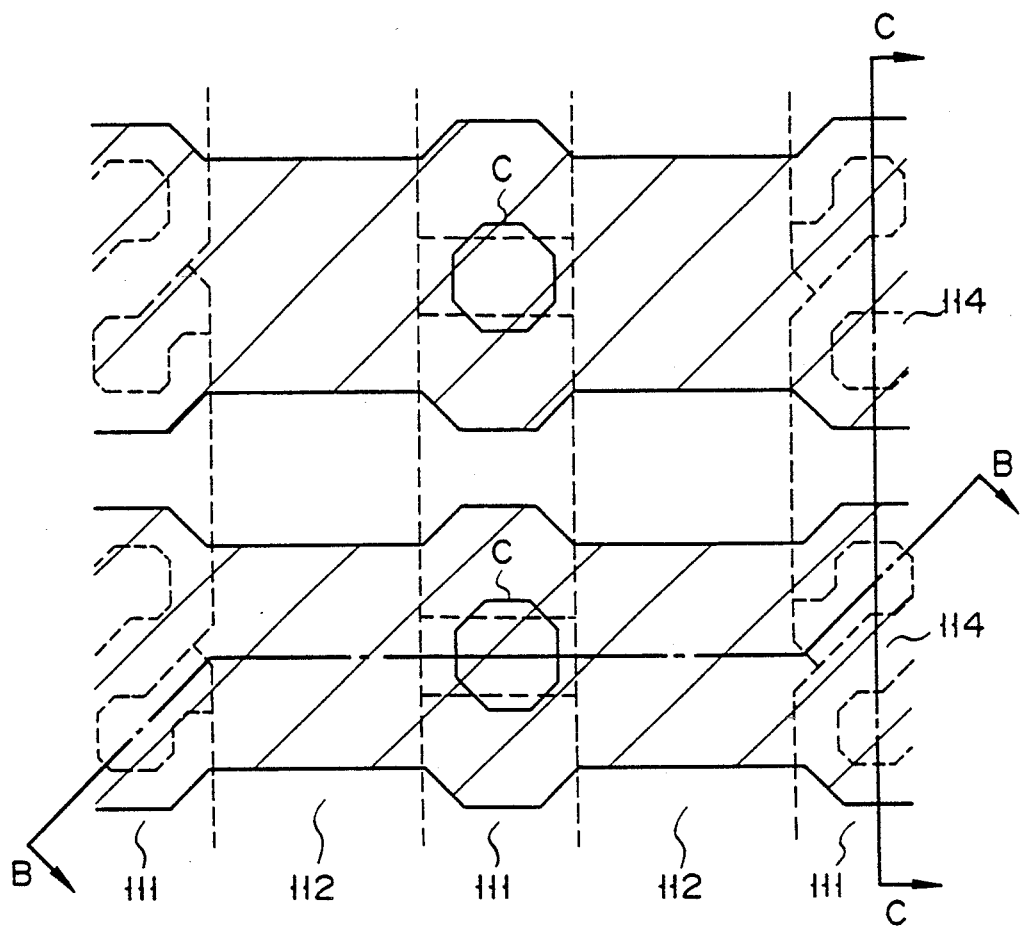
F I G. 15A
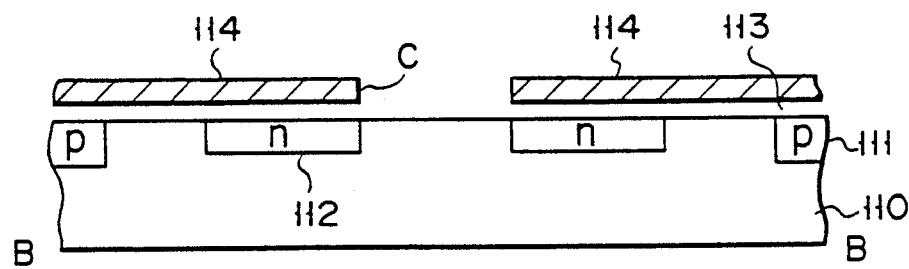
F I G. 15B
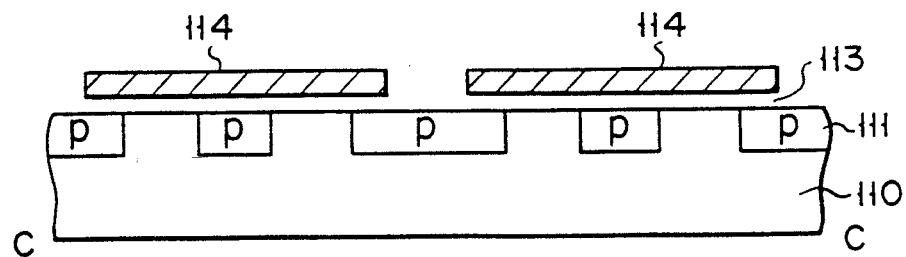
F I G. 15C

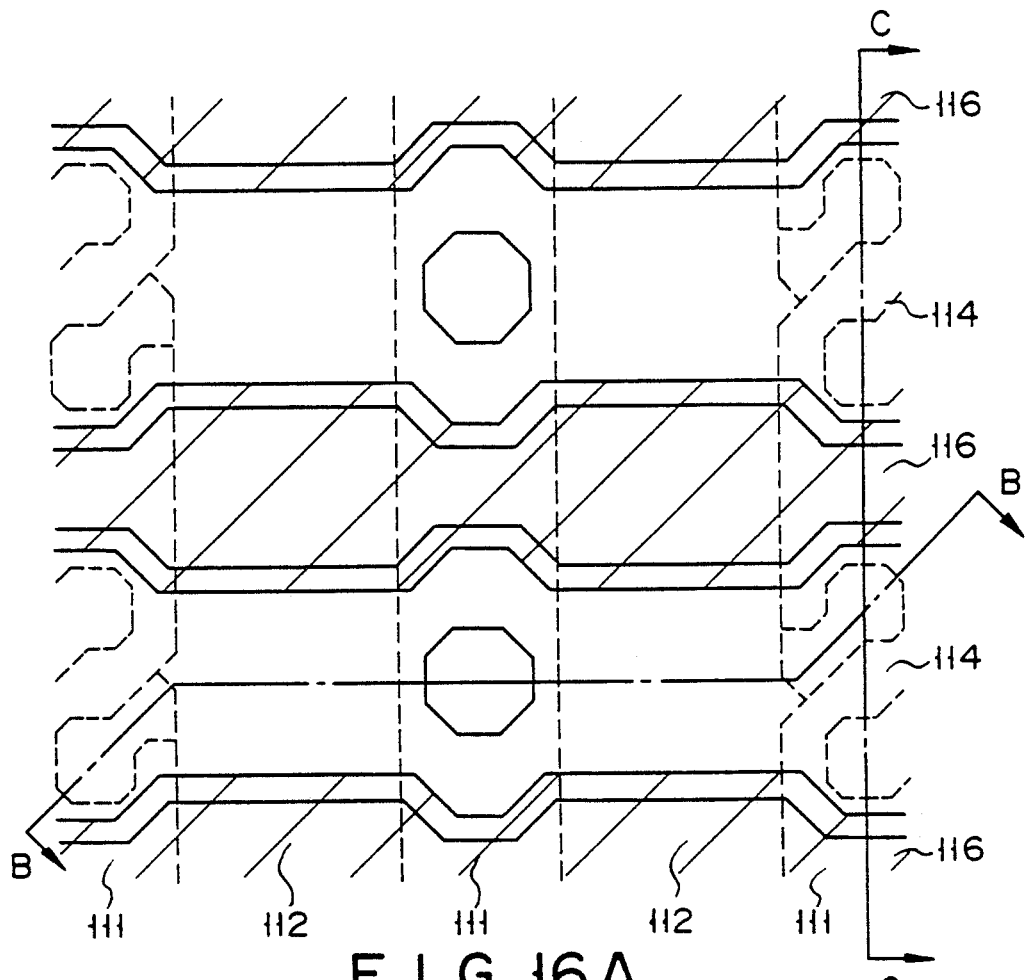
F I G. 16A
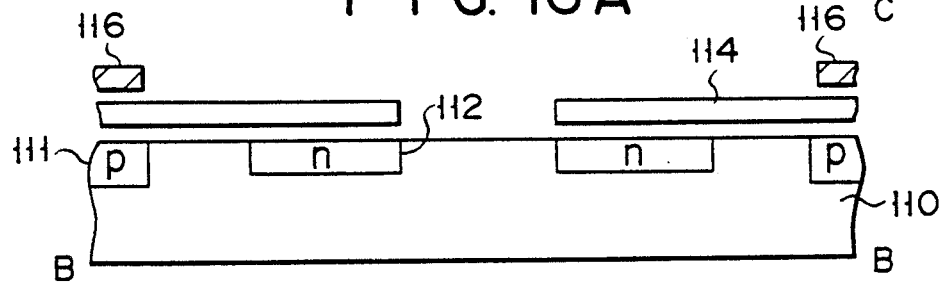
F I G. 16B
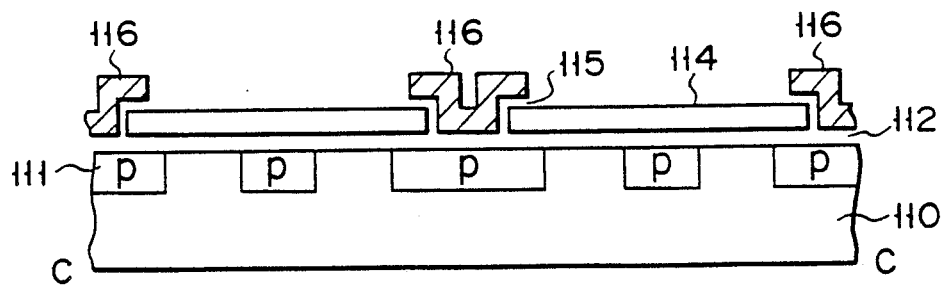
F I G. 16C

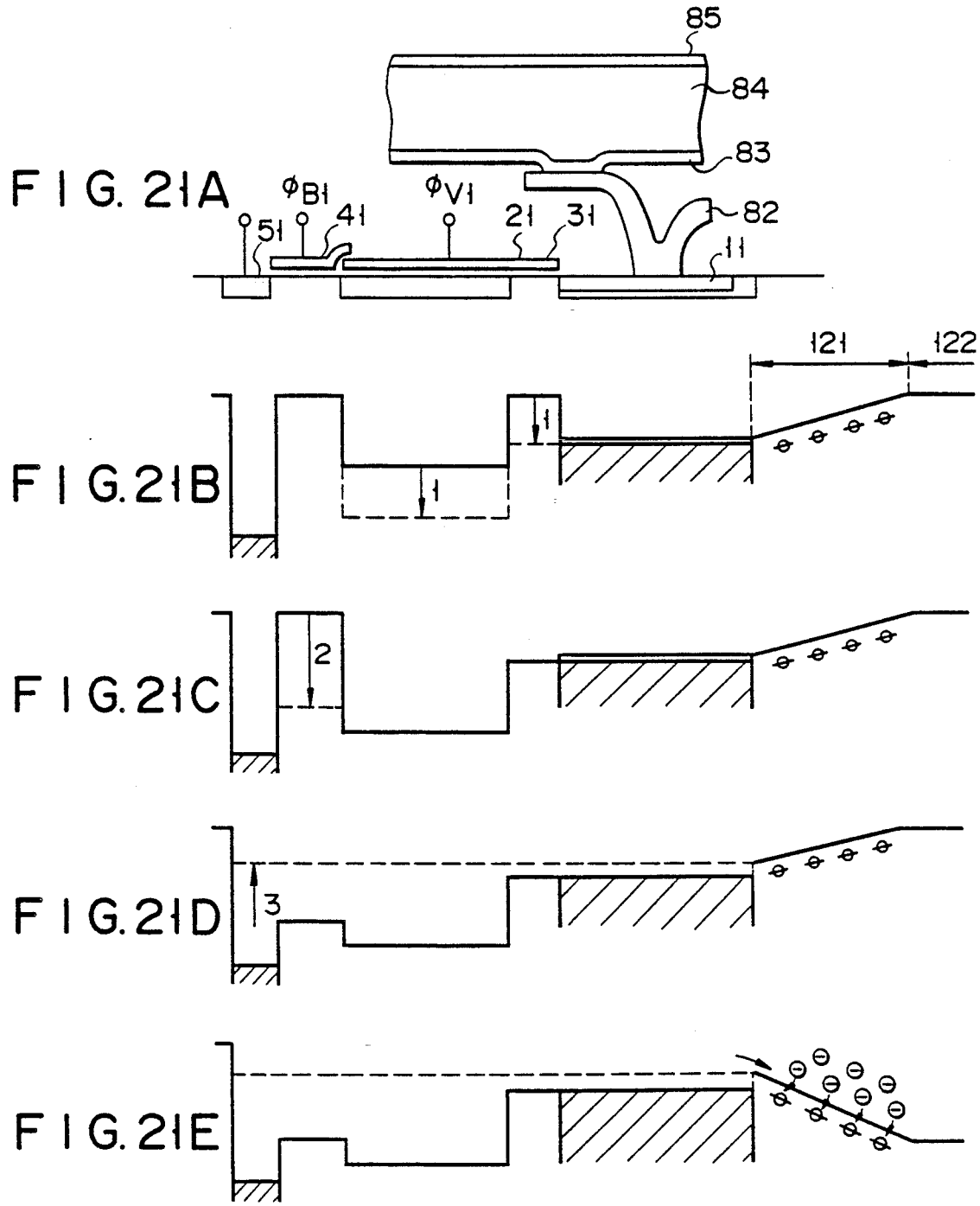

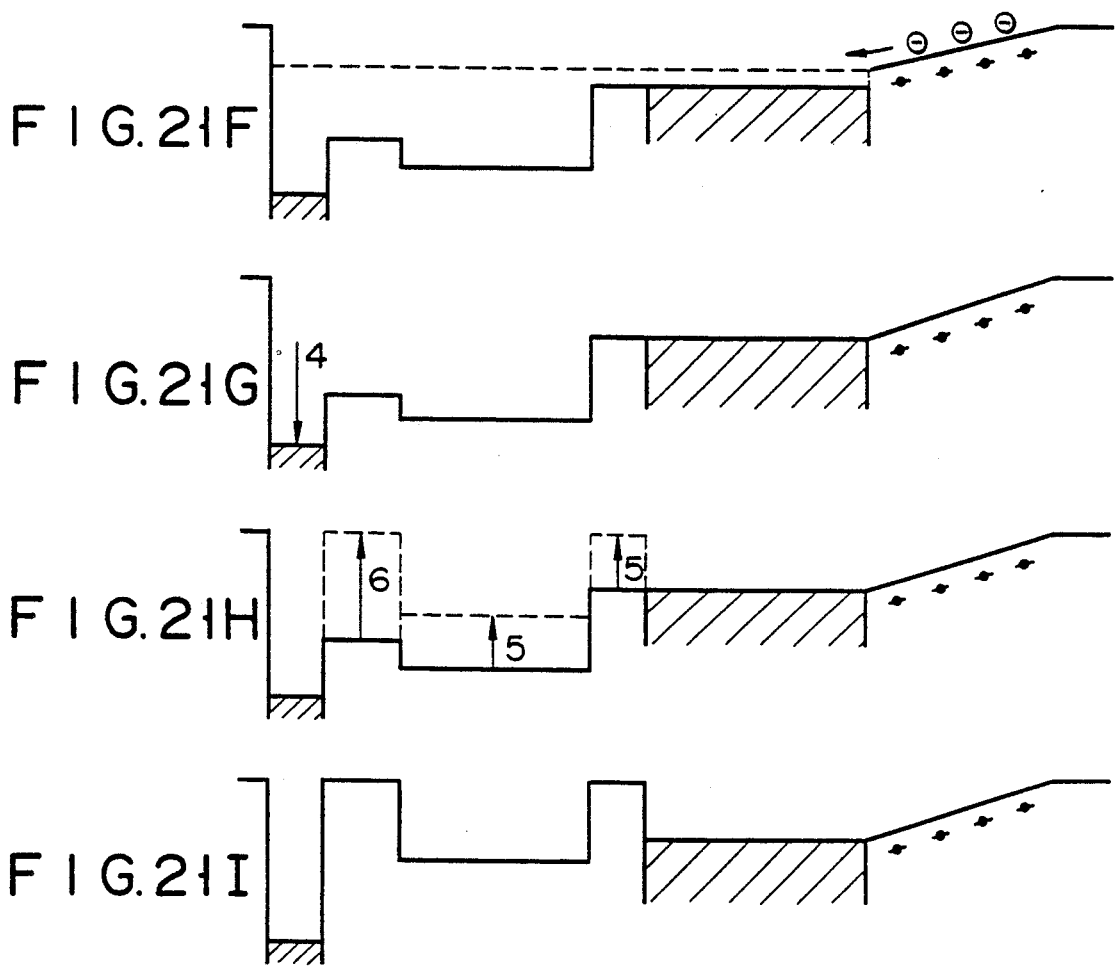

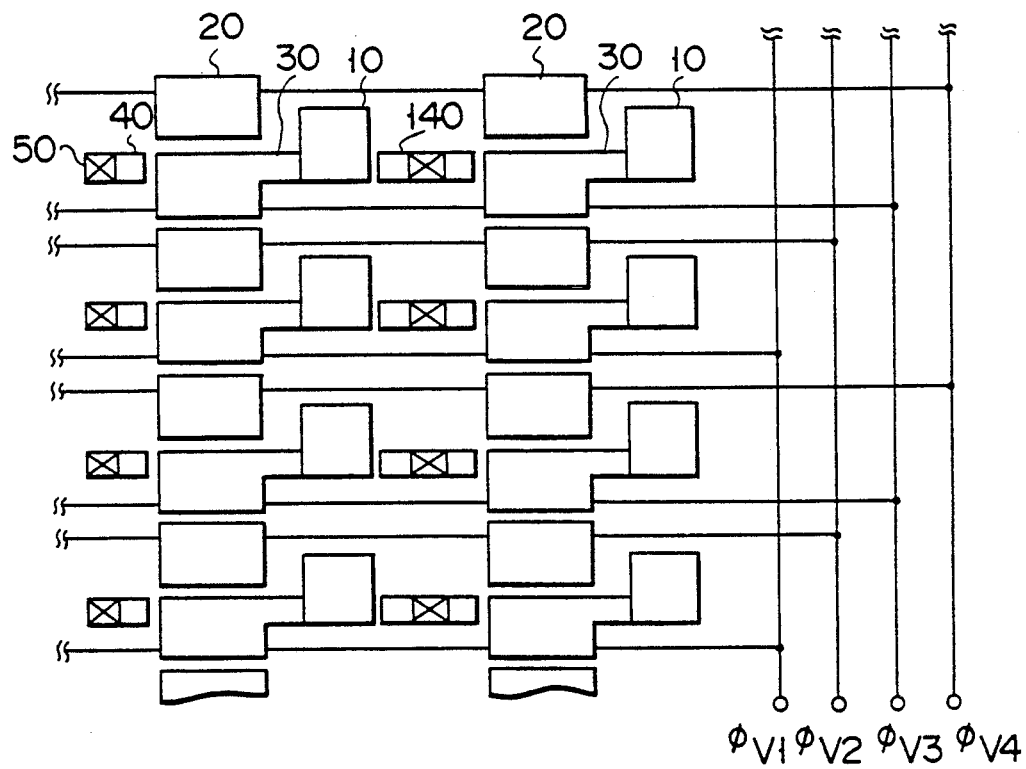
F I G. 22
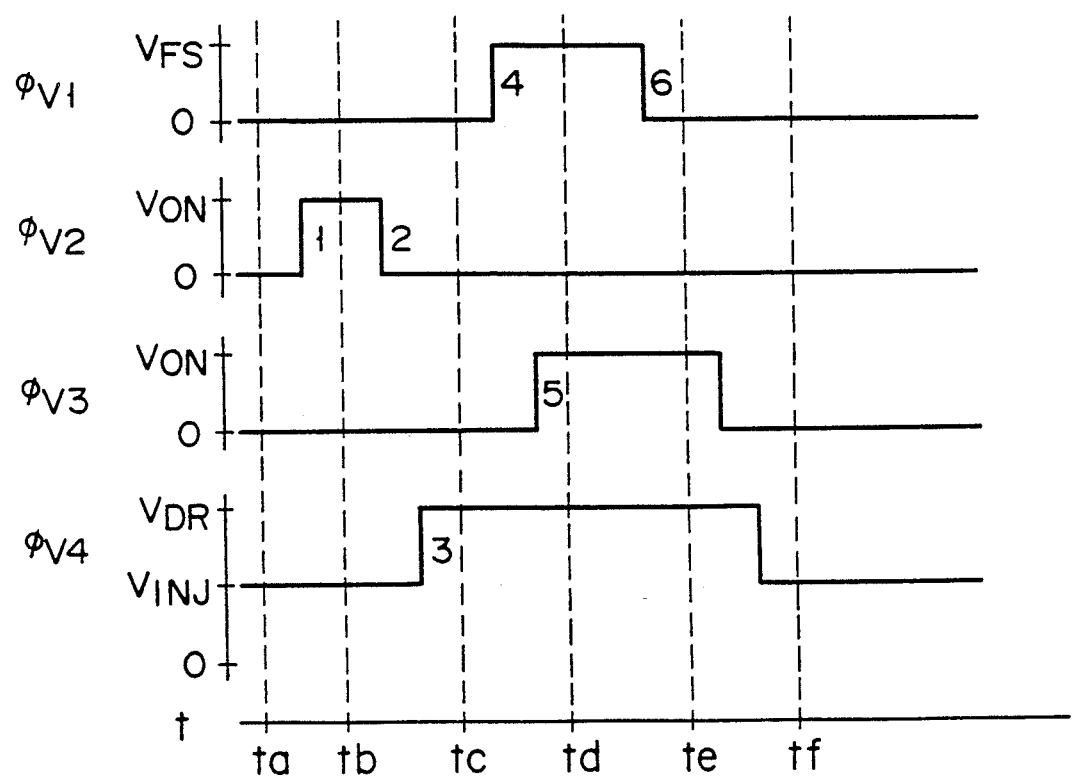
F I G. 24

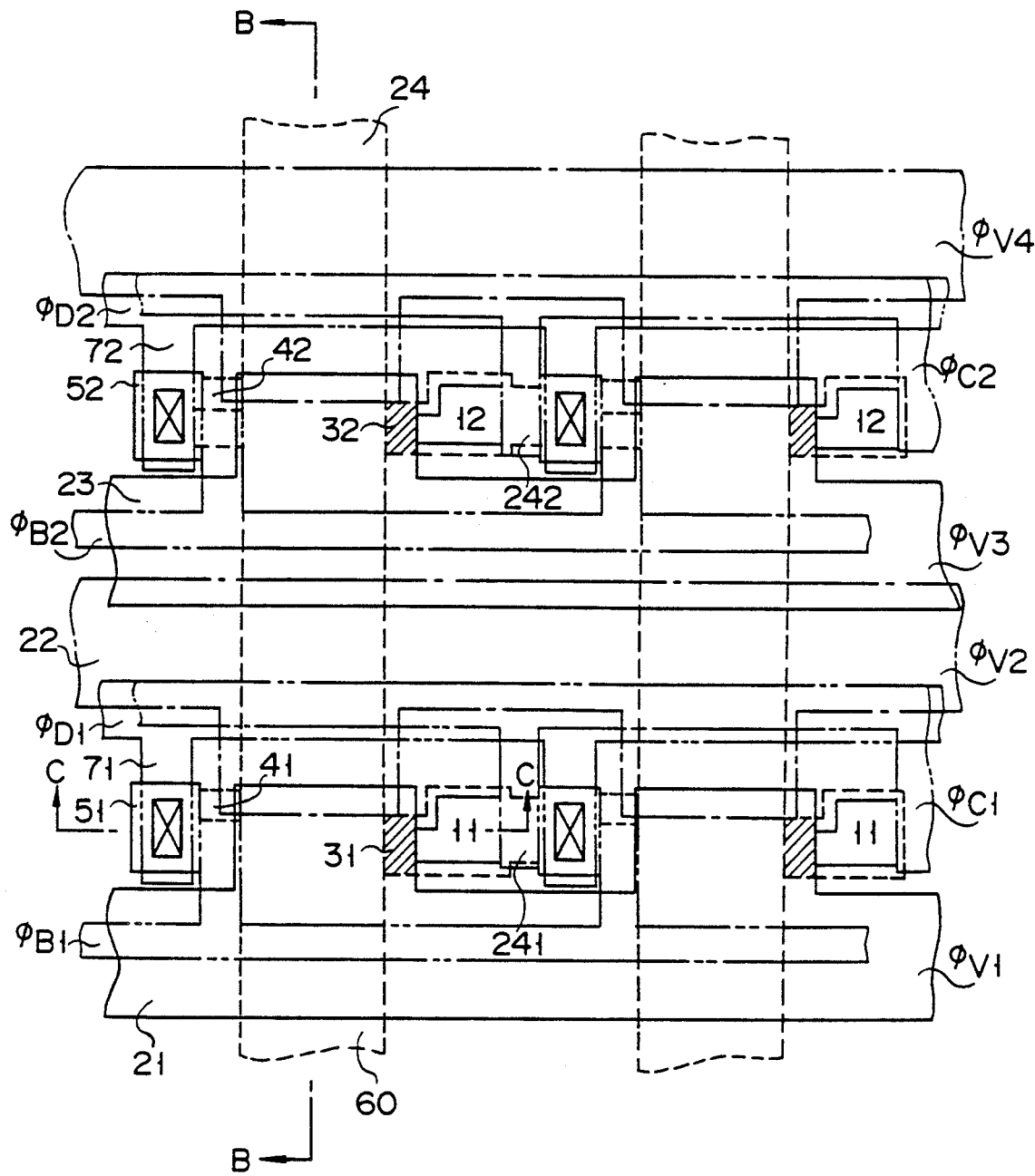
F I G. 23A

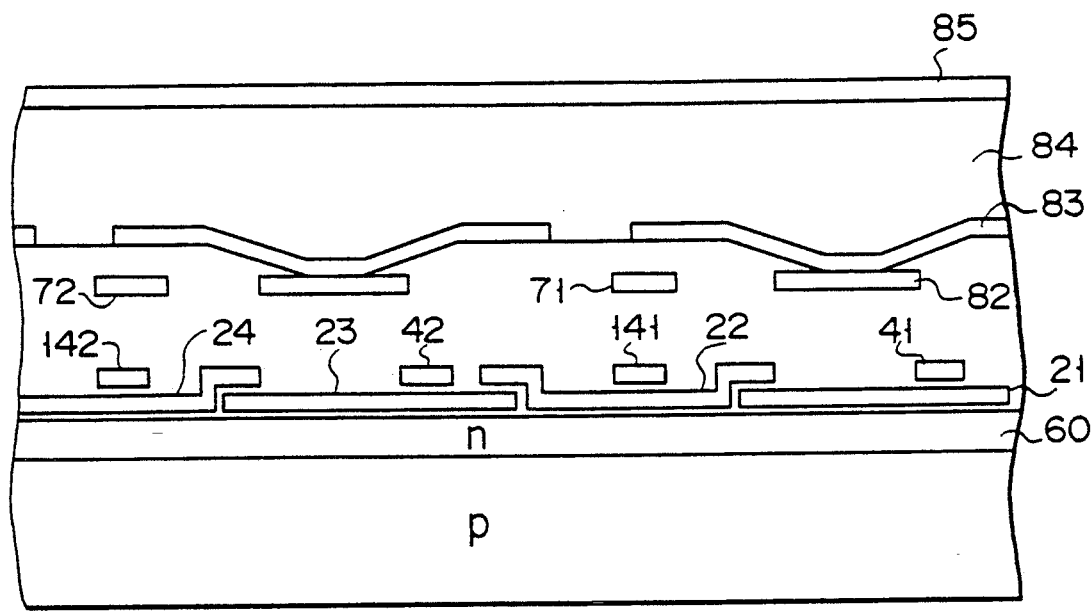
F I G. 23B
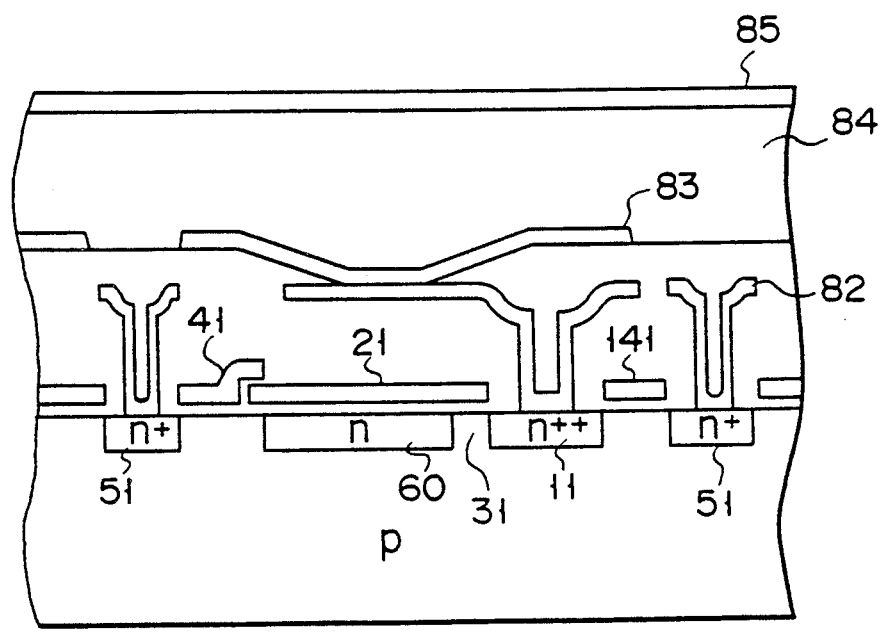
F I G. 23C

SOLID-STATE IMAGE SENSOR EMPLOYING A GATE AND DIODE FOR BIAS CHARGE INJECTION

BACKGROUND OF THE INVENTION

1. Field of the Invention

The present invention is directed to a solid-state image sensor, and relates particularly to a solid-state image sensor equipped with means for injecting bias charges.

A two-layered solid-state image sensor having a photoconductive film deposited on a solid-state image sensing element or a stacked solid-state image sensor can have a wide opening area of its photosensitive part, it has good characteristics of a high sensitivity and low smear. Because of this feature, this type of solid-state image sensor is considered promising as a camera for various monitor televisions or a high definition television. An amorphous film, such as an Se-As-Te film, ZnSe-ZnCdTe film or a-Si:H (amorphous silicon hydride) film, is used at present as a photoconductive film of such a stacked solid-state image sensor. Of these materials, an a-Si:H film is becoming popular due to its good characteristic and workability as well as its property to be formed at a low temperature.

With the use of a conventional solid-state image sensor as disclosed in, for example, IEEE Transaction on Electron Device, Vol. ED-32, No. 8, August 1985, light incident from a transparent electrode is photoelectrically converted by a photoconductive film to thereby provide electron-hole pairs. Since the potential of a pixel electrode electrically coupled to a storage diode is higher than that of the transparent electrode, electrons move toward the pixel electrode and holes move toward the transparent electrode. The holes flow out to an external circuit through the transparent electrode whereas the electrons are accumulated in the storage diode coupled to the pixel electrode t thereby reduce the potential of this diode. Signal charges (electrons) accumulated for a given period of time are read out on a vertical CCD channel from the storage diode when a signal charge read-out pulse is applied to a signal charge read-out gate. The charges transferred onto the vertical CCD channel are output through a horizontal CCD channel.

The above conventional solid-state image sensor has the following shortcomings. Since the storage diode is electrically coupled to a pixel electrode wire filled with free electrons, the storage diode would not be completely depleted and the transfer of the signal charges would be incomplete. This is likely to produce a capacitive lag. In addition, since the charges photoelectrically converted w thin the photoconductive film are trapped by the trapping level existing in the film and are discharged after a certain period of time, the residual image characteristic of the solid-state image sensor is impaired.

The residual image can be reduced by injecting bias charges in the storage diode; for a television camera employing an image pick-up tube, for example, the injection of the bias charges is done using light from a light source. With this method, however, it is significantly difficult to uniformly irradiate light on the chip so that a residual image cannot surely be reduced. Furthermore, the need for a separate light source complicates the structure of the solid-state image sensor.

As described above, according to the conventional solid-state image sensor transferring the signal charges from the storage diode is incomplete and a capacitive lag is produced. The conventional method for reducing a residual image by injecting bias charges by means of a light source does not ensure uniform injection of bias charges and complicates the structure of the image sensor.

SUMMARY OF THE INVENTION

Accordingly, it is an object of this invention to provide a solid-state image sensor capable of uniformly injecting bias charges in a signal charge storage diode without the need for any light source to thereby improve a residual image characteristic.

The core feature of this invention lies in that a gate and a diode are employed to electrically inject the bias charges in the storage diode.

According to one aspect of this invention, there is provided a solid-state image sensor comprising a solid-state image sensing element chip having a signal charge storage diode, a signal charge read-out section and a signal charge transfer section formed on a semiconductor substrate; a photoconductive film deposited on the chip; and a transparent electrode formed on the photoconductive film; wherein a bias-charge injecting gate and a bias-charge injecting diode are provided adjacent to the signal charge transfer section for injecting bias charges in the signal charge storage diode via the signal charge read-out section.

According to another aspect of this invention, there is provided a solid-state image sensor comprising a solid-state image sensing element chip having a signal charge storage diode, a signal charge read-out section and a signal charge transfer section formed on a semiconductor substrate; a photoconductive film deposited on the chip; and a transparent electrode formed on the photoconductive film; wherein a bias-charge injecting gate and a bias-charge injecting diode are provided adjacent to the signal charge storage diode for injecting bias charges in the signal charge storage diode, and a bias-charge discharging gate and a bias-charge discharging diode are provided adjacent to the signal charge transfer section for discharging the bias charges, injected in the signal charge storage diode, via the signal charge read-out section.

According to this invention, a gate and a diode for electrically injecting bias charges in a signal charge storage diode are provided to ensure injection of bias charges in the storage diode without using a light source. It is therefore possible to uniformly inject bias charges to sufficiently reduce a capacitive residual image. In addition, since a dark current does not depend on bias charges if the bias charges once injected are discharged via the signal charge read-out gate, a variation in bias charges can be neglected.

BRIEF DESCRIPTION OF THE DRAWINGS

FIG. 2B is a cross section of the solid-state image sensor along the line B—B in FIG. 2A;

FIG. 2C is a cross section of the solid-state image sensor along the line C—C in FIG. 2A;

FIGS. 4A through 4L are diagrams illustrating a schematic cross section of the solid-state image sensor along the line B—B in FIG. 2A and changes in potential state;

FIGS. 9A through 9E are diagrams illustrating a schematic cross section of the solid-state image sensor along the line B—B in FIG. 2A and changes in potential state of the image sensor;

FIG. 12A is an enlarged plan view of part of the solid-state image sensor shown in FIG. 11;

FIGS. 14A through 19C are diagrams illustrating the structure of a semiconductor in individual steps for manufacturing the solid-state image sensor shown in FIGS. 12A–12C;

FIGS. 21A through 21I are diagrams illustrating a cross section of a solid-state image sensor driven by the timing chart shown in FIG. 20 and changes in potential state of the image sensor;

FIG. 22 is an exemplary plane view illustrating the fundamental structure of a solid-state image sensor according to another embodiment;

FIG. 23A is a plane view of the solid-state image sensor shown in FIG. 22;

FIG. 23B is a cross section of the solid-state image sensor along the line B—B in FIG. 23A;

FIG. 23C is a cross section of the solid-state image sensor along the line C—C in FIG. 23A;

FIG. 24 is a signal waveform diagram illustrating drive pulses to a transfer electrode, a bias-charge injecting gate, a bias-charge discharging gate and a diode.

DETAILED DESCRIPTION OF THE PREFERRED EMBODIMENTS

Figure 1:
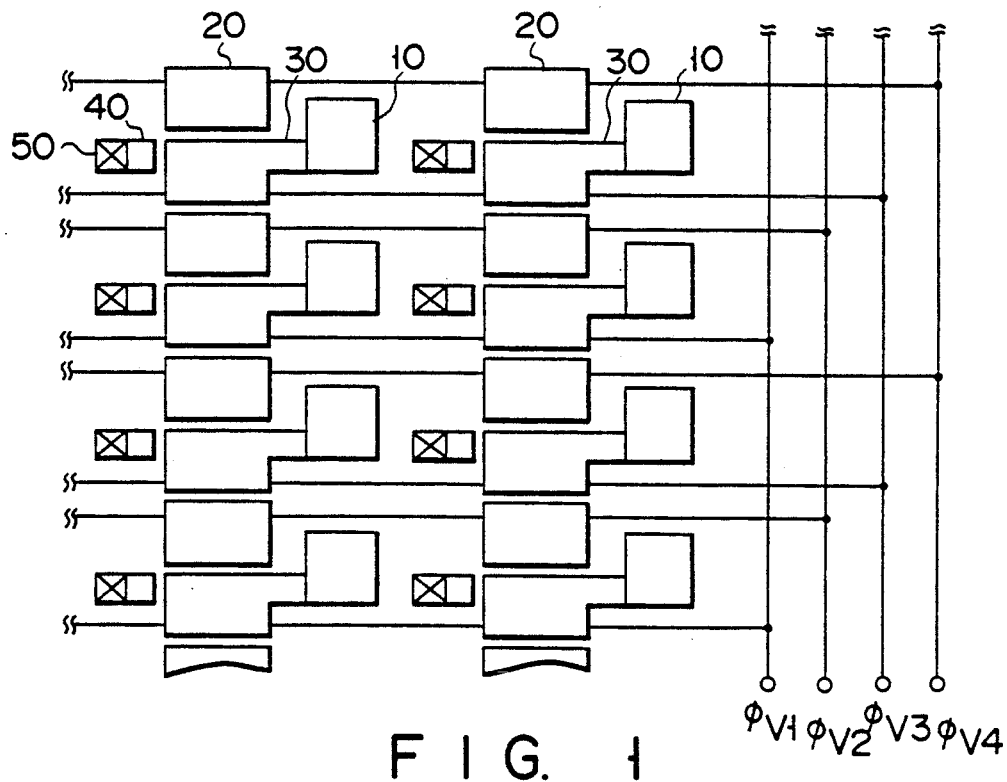
FIG. 1 is an exemplary plan view illustrating the fundamental structure of a solid-state image sensor.

In a stacked solid-state image sensor shown in FIG. 1, a plurality of signal charge storage diodes 10 are arranged in matrix on an Si substrate and transfer electrodes of a vertical CCD are provided in columns and adjacent to the storage diodes 10. These transfer electrodes are applied with drive pulses $\phi_{V1}$, $\phi_{V2}$, $\phi_{V3}$ and $\phi_{V4}$, and the vertical CCD is of a 4-phase driven type. Those electrodes 20 to which the drive pulses $\phi_{V1}$ and $\phi_{V3}$ also serve as signal charge read-out gates 30.

This solid-state image sensor has charge injecting gates 40 and charge injecting diodes 50. These gates 40 and diodes 50 are provided opposite the storage diodes 10 of the vertical CCD. Drive pulses $\phi_{B1}$ and $\phi_{B2}$ are applied to the gates 40, and drive pulses $\phi_{D1}$ and $\phi_{D2}$ to the diodes 50. This arrangement permits bias charges to be injected in the storage diodes 10 from the diodes 50 via the gates 40 and read-out gates 30.

Figure 2A:
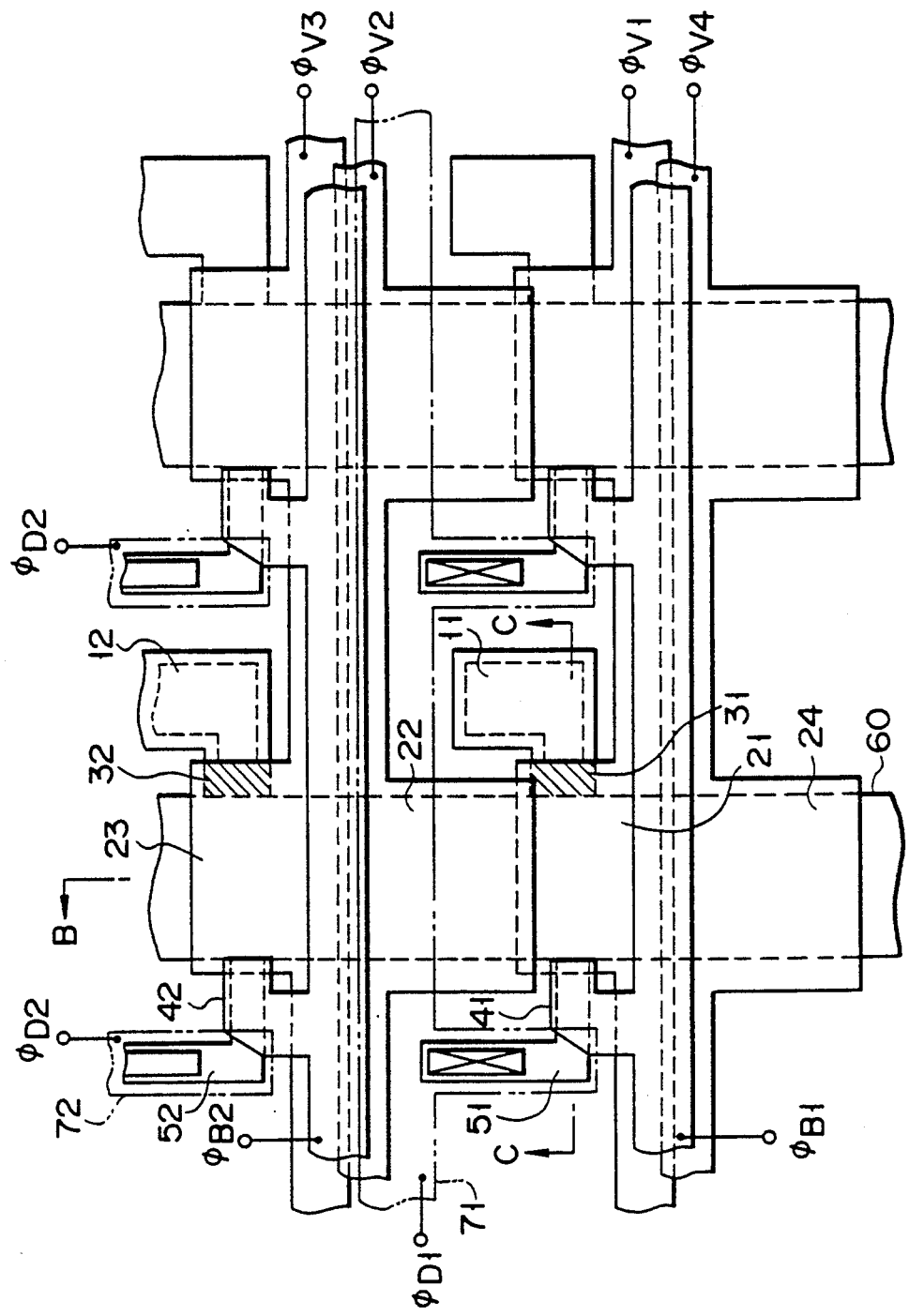
FIG. 2A is a plan view of the solid-state image sensor shown in FIG. 1.

Referring to the plan view of the solid-state image sensor in FIG. 2A, of the transfer electrodes 20, those electrodes 21, 23 to which the drive pulses $\phi_{V1}$ and $\phi_{V3}$ are applied constitute a first poly Si layer, whereas those electrodes 22, 24 applied with the drive pulses $\phi_{V2}$ and $\phi_{V4}$ constitute a second poly Si layer. The gates 40 constitute a third poly Si layer. A plurality of vertical CCD channels 60 are vertically provided. An electrode 51 is coupled to the bias-charge injecting diodes 50. The storage diodes 10 each have a diode 11 adjacent to the transfer electrode 21 and a diode 12 adjacent to the transfer electrode 23. Similarly, each read-out gate 30, each bias-charge injecting gate 40, each bias-charge injecting diode 50 and each bias-charge injecting electrode 70 respectively has a signal charge read-out gate 31, a bias-charge injecting gate 41, a bias-charge injecting diode 51 and a bias-charge injecting electrode 71 with respect to the storage diode 11, and respectively has a signal charge read-out gate 32, a bias-charge injecting gate 42, a bias-charge injecting diode 52 and a bias-charge injecting electrode 72 with respect to the storage diode 12.

As shown in FIGS. 2B and 2C, the signal charge type CCD channel region 60 is formed on a p type substrate 81. The transfer electrodes 21 to 24 are sequentially formed on the channel region 60 along this region. The diode region 11 is formed adjacent to the channel region 60, and a pixel electrode wire 82 is coupled to this diode region 11. The bias-charge injecting diode region 51 is formed on one side of the channel region 60 opposite the diode region 11. The bias-charge injecting electrode 71 is coupled to this diode region 51. The bias-charge injecting gate electrodes 41 and 42 are insulatively formed on the substrate 81 between the diode region 51 and the channel region 60. The gate electrode 41 is extending above the area between the transfer electrodes 21 and 24, and the gate electrode 42 above the area between the transfer electrodes 22 and 23. The bias-charge injecting electrodes 71 and 72 are extending above the transfer electrodes through insulating layers. The pixel electrode wire 82 is coupled to a pixel electrode 83.

A photoconductive film 84 is formed on the entire top surface of the above semiconductor structure, and a transparent electrode 85 is formed on the entire top surface of this photoconductive film 84.

The operation of this image sensor will be described below.

Figure 3:
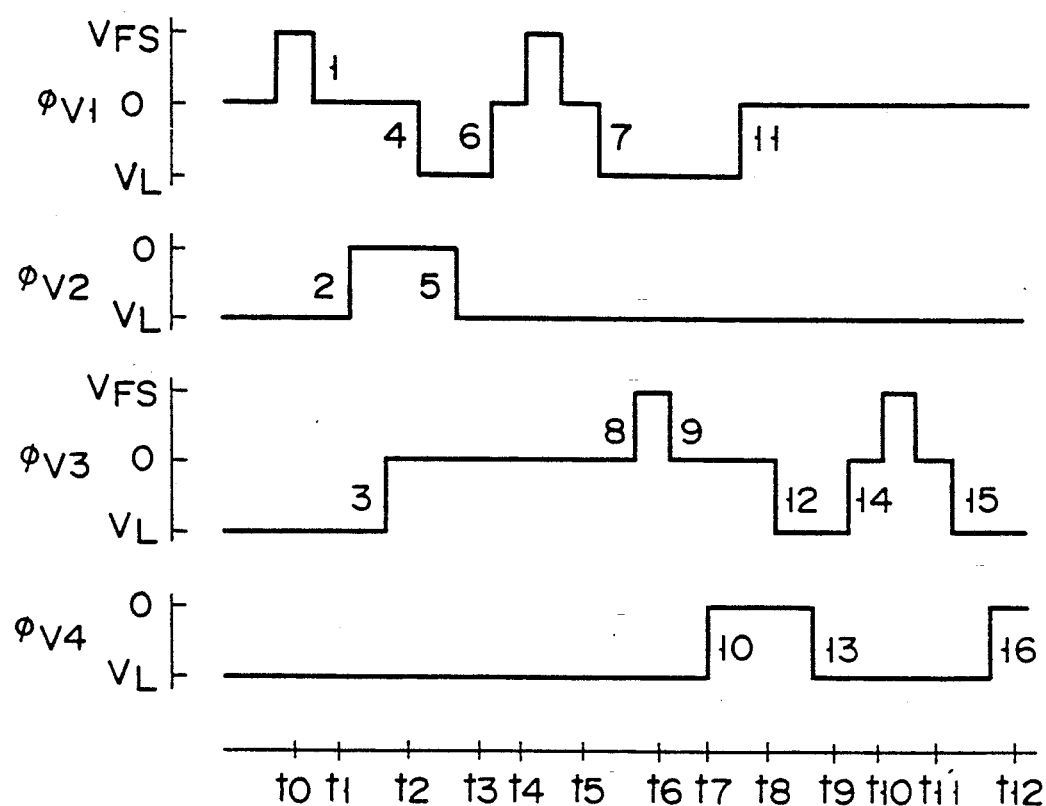
FIG. 3 is a signal waveform diagram illustrating drive pulses to a transfer electrode.

FIG. 3 illustrates a timing chart of the drive pulses $\phi_{V1}$-$\phi_{V4}$ to the transfer electrodes 20, and FIG. 4 illustrates a schematic cross section of the solid-state image sensor along the line A—A in FIG. 2A and a change in potential state in the sensor. Numerals "1" to "16" given in FIG. 3 correspond to those given in FIG. 4.

As shown in FIG. 3, when the voltage $\phi_{V1}$ of the read-out gate 31 becomes a voltage $V_{FS}$ between times $t_0$ and $t_1$, signal charges are read out from the storage diode 11 onto a channel under the transfer electrode 21 as shown in FIGS. 4A to 4C. When the drive pulses $\phi_{V1}$-$\phi_{V4}$ of the individual transfer electrodes 20 change as shown in FIG. 3 during an interval between times $t_1$ and $t_4$, the signal charges are transferred onto a channel under the transfer electrode 23 as shown in FIGS. 4C to 4E. Between times $t_4$ and $t_5$, bias charges are injected in the storage diode 11 by the present method. The injection of the bias charges will be described later.

When the voltage $\phi_{V3}$ of the read-out gate 32 becomes a voltage $V_{FS}$ between times $t_5$ and $t_7$, signal charges are read out from the storage diode 12 and the signal charges are added with those in the storage diode 11 in a channel under the transfer electrode 23, as shown in FIGS. 4E to 4G. When the drive pulses $\phi_{V1}$-$\phi_{V4}$ of the individual transfer electrodes 20 change as shown in FIG. 3 during an interval between times $t_7$ and $t_{10}$, the signal charges are transferred onto a channel under the next transfer electrode 21 as shown in FIGS. 4G to 4J. Between times $t_{10}$ to $t_{11}$, bias charges are injected in the storage diode 12. The above-described transferring of the signal charges is the same as is done in the conventional interlaced scanning system (field storage mode).

The following will describe how to inject bias charges. Although the description of the injection of bias charges will be given with reference to the storage diode 11, the same method can apply to injecting bias charges in the storage diode 12.

Figure 5:
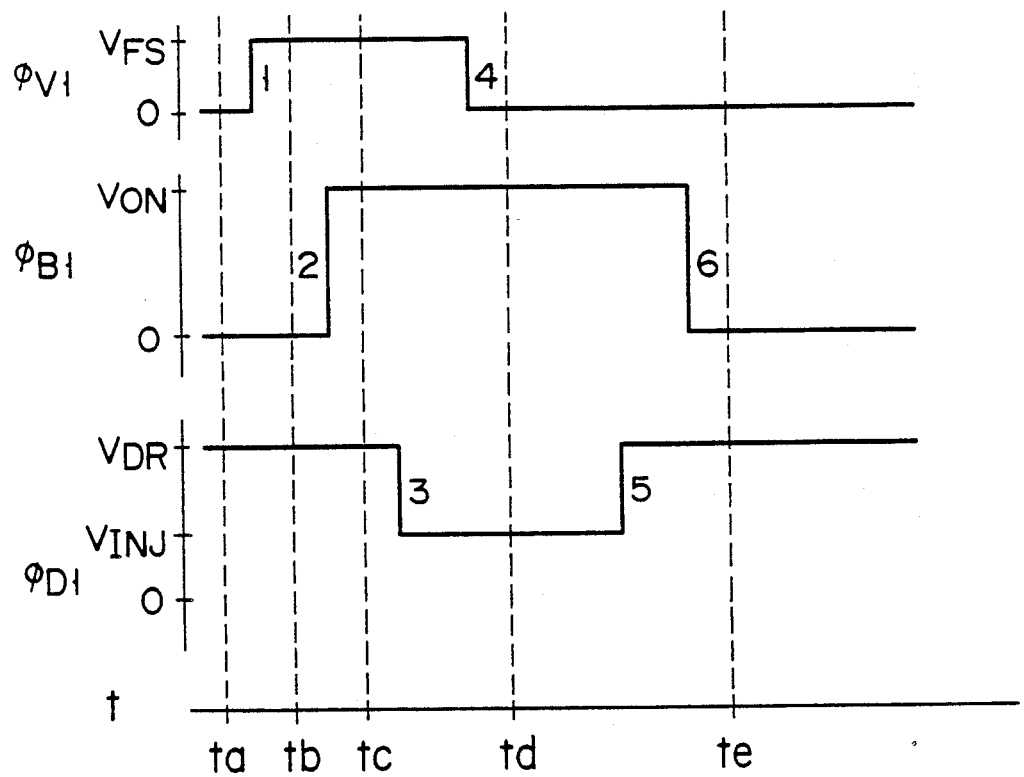
FIG. 5 is a signal waveform diagram illustrating drive pulses to a transfer electrode, a bias-charge injecting gate and a bias-charge injecting diode.

FIG. 5 illustrates the drive pulses $\phi_{V1}$, $\phi_{B1}$ and $\phi_{D1}$ to the transfer electrode 21, bias-charge injecting gate 41 and bias-charge injecting diode 51, and FIG. 6 illustrates a schematic cross section of the solid-state image sensor along the line B—B in FIG. 2A and a change in potential state in the sensor. Numerals "1" to "6" given in FIG. 5 are timings corresponding to those given in FIG. 6. "ta" and "te" in FIG. 5 respectively correspond to "$t_4$" and "$t_5$" in FIG. 3.

Figure 6A:
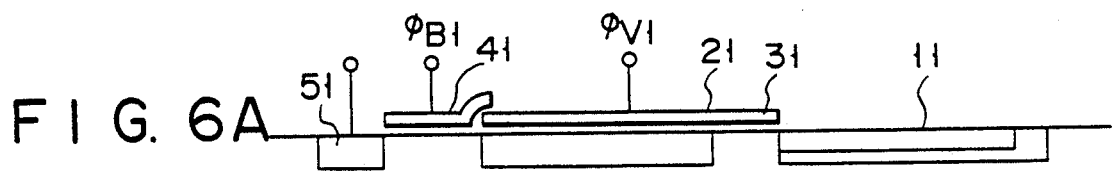
FIGS. 6A through 6E are diagrams illustrating a schematic cross section of the solid-state image sensor along the line B—B in FIG. 2A and changes in potential state of the image sensor.
Figure 6B:
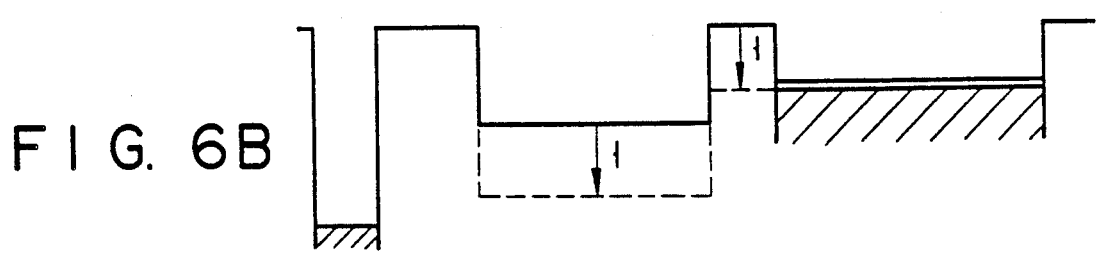
Figure 6C:
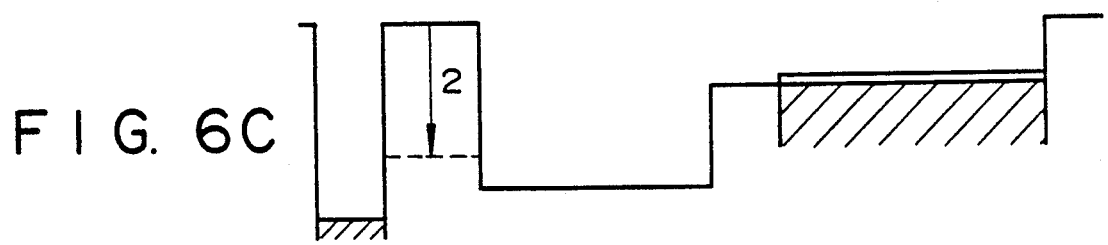
Figure 6D:
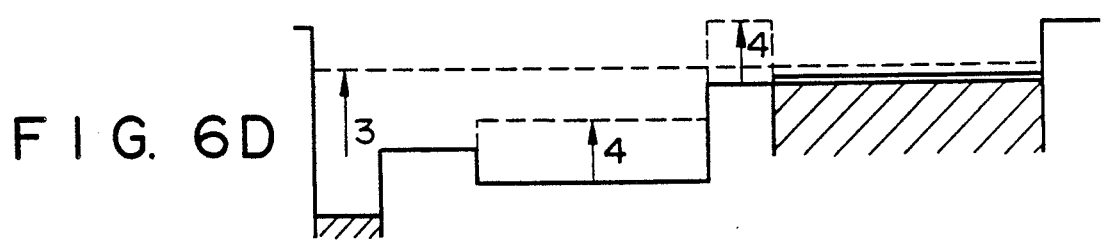

When the same voltage $V_{FS}$ as given for reading out signal charges is applied to the transfer electrode 21 during an interval between $t_a$ and $t_b$ as shown in FIG. 5, the read-out gate 31 is rendered ON as shown in FIGS. 6A and 6B. When a voltage $V_{ON}$ is applied to the bias-charge injecting gate 41 between $t_b$ and $t_c$, this gate 41 is opened as shown in FIG. 6C. When a voltage to be applied to the bias-charge injecting diode 51 changes to $V_{INJ}$ from $V_{DR}$ during an interval between $t_c$ and $t_d$, the bias charges are injected into the storage diode 11 via the bias-charge injecting gate 41 and read-out gate 31, as shown in FIG. 6D. Further, when the voltage to be applied to the transfer electrode 21 changes to 0 V from $V_{FS}$, the read-out gate 31 is rendered OFF and a specific amount of bias charges remain in the storage diode 11.

Figure 6E:
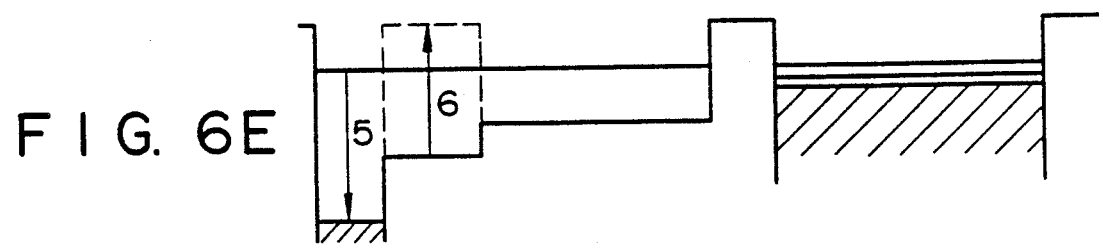

When the voltage to be applied to the bias-charge injecting diode 51 changes to $V_{DR}$ from $V_{INJ}$ during an interval between $t_d$ and $t_e$, excess bias charges are discharged into this diode 51 as shown in FIG. 6E. Finally, the voltage of the bias-charge injecting gate 41 becomes 0 V to thereby close this gate 41. This completes a sequence of bias-charge injecting operations.

Figure 7:
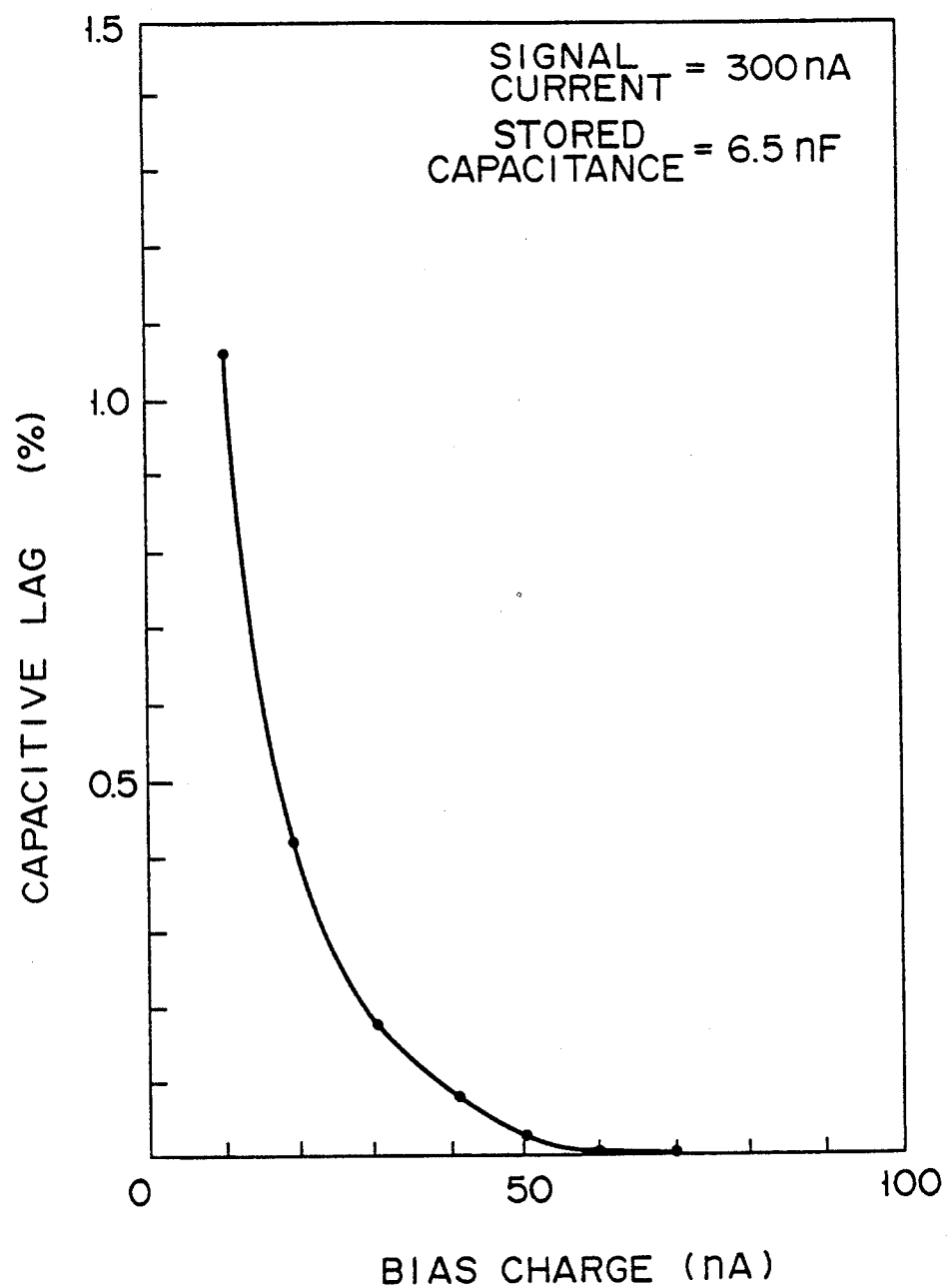
FIG. 7 is a characteristic diagram illustrating the relation between bias charges and values of a residual image for one field.

FIG. 7 illustrates the relation between bias charges and values of an residual image for one field with the stored capacitance being 6.5 nF and a signal current being 300 nA. As should be understood from this diagram, the value of the residual image becomes negligibly small below 0.1% when bias charges of about 40 nA in terms of current are injected into the storage diode. According to this embodiment, bias charges of 40 nA enough to sufficiently reduce a residual image can be injected by making the potential $V_{INJ}$ of the bias-charge injecting diode at the time of charge injection lower by 0.1 V than the potential of the signal charge read-out part.

According to this embodiment, as described above, the gates 40 and diodes 50 are provided to electrically inject bias charges into the signal charge storage diodes 10, so that the bias charges can be injected in the storage diodes 50 without requiring any light source. Accordingly, bias charges enough to sufficiently reduce a capacitive residual image can be uniformly injected in the storage diodes 10, which is significantly effective in reducing a residual image. Due to the solid-state image sensor being of a stacked type, even provision of the bias-charge injecting gates 40 and diodes 50 does not cause such an inconvenience as reducing the area of a photosensitive part.

A description will now be given of another way of driving the solid-state image sensor shown in FIG. 1.

That operation other than the injecting of bias charges as described earlier with reference to FIGS. 5 and 6 is the same as done in the above-described embodiment.

Figure 8:
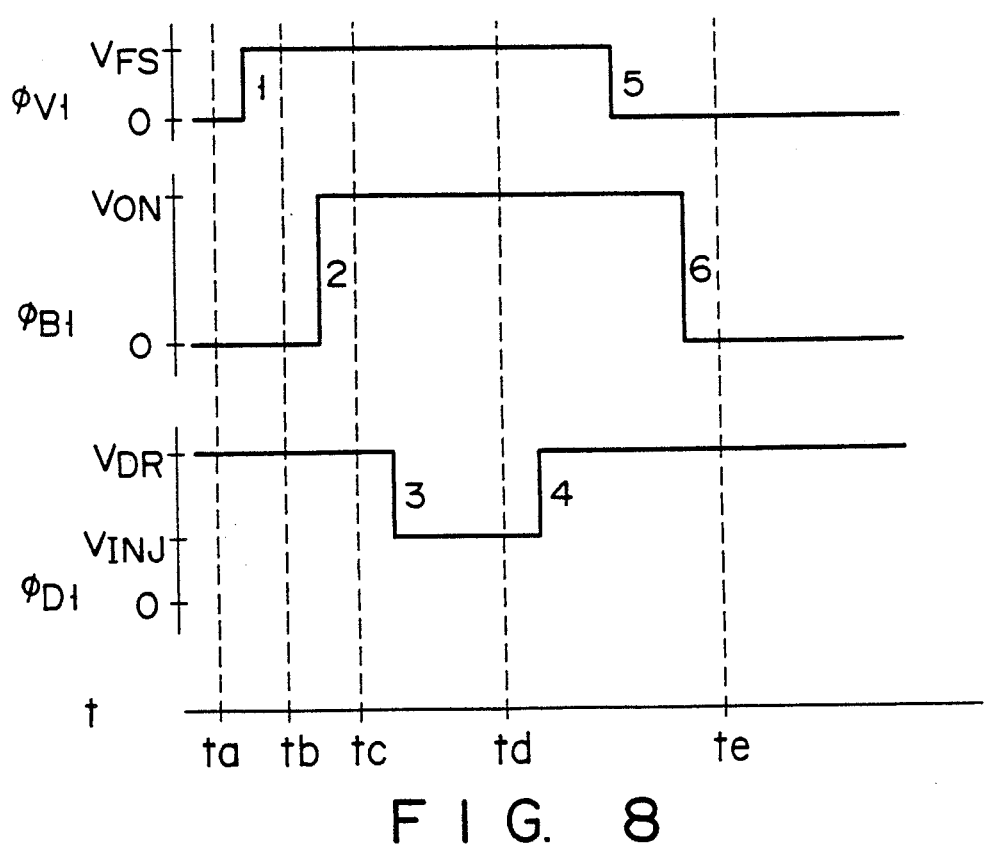
FIG. 8 is a signal waveform diagram illustrating drive pulses to a transfer electrode, a bias-charge injecting gate and a bias-charge injecting diode.

FIG. 8 illustrates the drive pulses $\phi_{V1}$, $\phi_{B1}$ and $\phi_{D1}$ to the transfer electrode 21, bias-charge injecting gate 41 and bias-charge injecting diode 51, and FIGS. 9A through 9E illustrate a schematic cross section of the solid-state image sensor along the line B—B in FIG. 2A and a change in potential state in the sensor. Numerals "3" to "6" given in FIG. 8 are timings corresponding to those given in FIG. 9. Times "ta" and "te" in FIG. 8 respectively correspond to "$t_4$" and "$t_5$" in FIG. 3.

This driving method differs from the previous one in that bias charges temporarily injected into the signal charge storage diode 11 are discharged to the bias-charge injecting diode 51 via the read-out gate 31. The operation from $t_a$ to $t_c$ is the same as that performed in the previous embodiment. When a voltage to be applied to the bias-charge injecting diode 51 changes to $V_{INJ}$ from $V_{DR}$ during an interval between $t_c$ and $t_d$, the bias charges are injected into the storage diode 11 via the bias-charge injecting gate 41 and read-out gate 31, as shown in FIG. 9B. When the voltage to be applied to the bias-charge injecting diode 51 changes to $V_{DR}$ from $V_{INJ}$ during an interval between $t_d$ and $t_e$, bias charges temporarily stored in the storage diode 11 are discharged into this diode 51 as shown in FIG. 9C. When the voltage to be applied to the transfer electrode 21 changes to 0 V and $V_{FS}$, the read-out gate 31 is rendered OFF and a specific amount of bias charges remain in the storage diode 11, as shown in FIG. 9D. Finally, the voltage of the bias-charge injecting gate 41 becomes 0 V to thereby close this gate 41, as shown in FIG. 9E. This completes a sequence of bias-charge injecting operations.

In the above embodiment, the bias charges are discharged by causing a change in voltage of the bias-charge injecting diode 51 from $V_{INJ}$ to $V_{DR}$ prior to disabling the read-out gate 31. Alternately, the bias charges may be discharged by temporarily disabling the read-out gate 31, then enabling the gate again.

Figure 10:
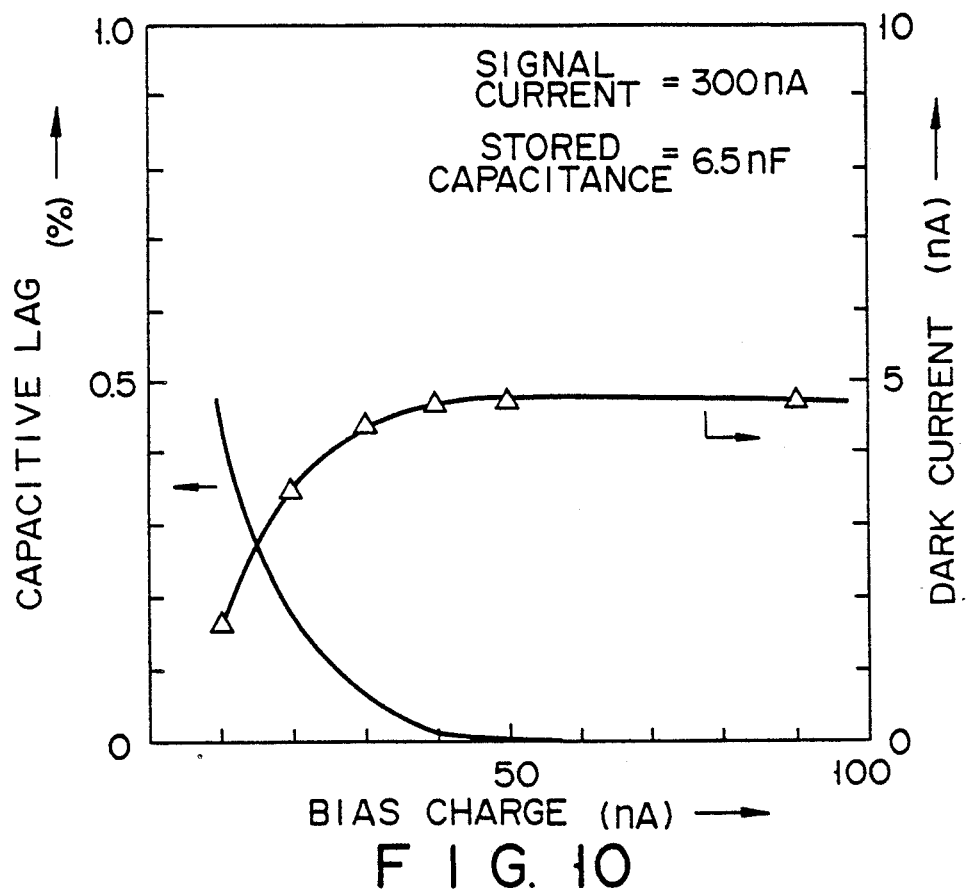
FIG. 10 is a characteristic diagram illustrating the relation between bias charges and values of a residual image and a dark current for one field.

FIG. 10B illustrates the relation between bias charges and the values of a residual image and a dark current for the first field according to the embodiment. According to this embodiment, when the amount of bias charges injected becomes a specific level or greater, the dark current hardly depends on the bias charges. If the amount of the bias charges to be injected in the storage diode is above a specific level even though it varies from one pixel to another, such a variation does not cause a variation in dark current and is therefore negligible. Therefore, this embodiment provides an advantage of making a variation in bias charges negligible in addition to the same effect as obtained in the previous embodiment.

The present invention is in no way restricted to the above particular embodiments. For instance, the bias-charge injecting gates and diodes should not necessarily be provided opposite the signal charge storage diodes of the CCD channel, but may be provided on the side of the storage diodes as long as the arrangement can permit bias charges to be injected in the storage diodes via the signal charge read-out gates. Although only the bias-charge injecting gates and diodes are provided in the above embodiments, bias-charge discharging gates and diodes may be provided adjacent to each charge transfer section in addition to the bias-charge injecting gates and diodes provided adjacent to the signal charge storage diodes. If the bias-charge discharging diode and gate can discharge the bias charges through the signal-charge read-out gate, the position on which they are disposed is not limited. Further, the present invention can apply to general CCD image sensors as well as the stacked type explained above.

As described in detail, according to this invention, bias-charge injecting gates and diodes and bias-charge discharging gates and diodes are provided so as to ensure electrical injection and discharging of bias charges in and from the storage diode. Therefore, bias charges can be uniformly injected in the signal charge storage diode without requiring a light source, thus improving the residual image characteristic.

Figure 11:
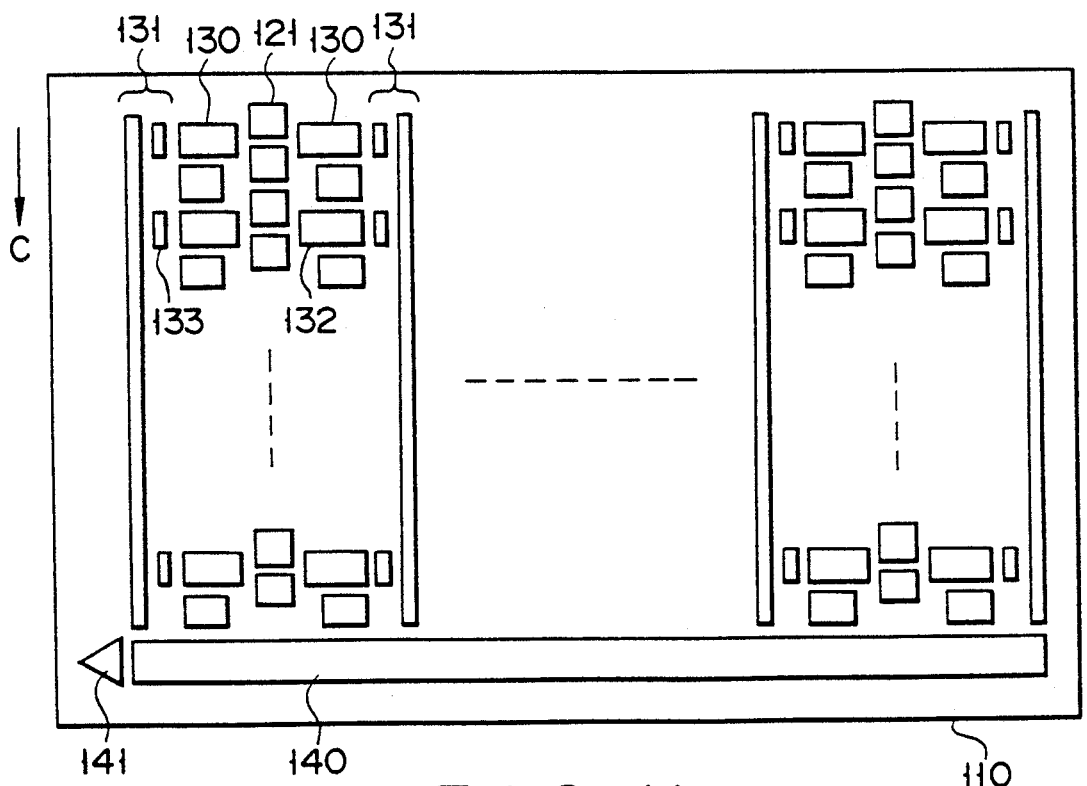
FIG. 11 is a plan view illustrating a solid-state image sensor according to another embodiment of this invention.

Referring now to FIG. 11, another embodiment will be described.

According to this embodiment, storage diodes 121 are arranged in matrix on a semiconductor substrate 110, and a plurality of vertical registers 130 are formed adjacent to the diodes 121 in the vertical direction (C direction). A plurality of bias-charge injecting/discharging sections 131 ar provided adjacent to these registers in the vertical direction. A horizontal register 140 is provided at one end of the vertical registers 130, and a change detector 141 is provided at one end of the register 140.

Figure 12B:
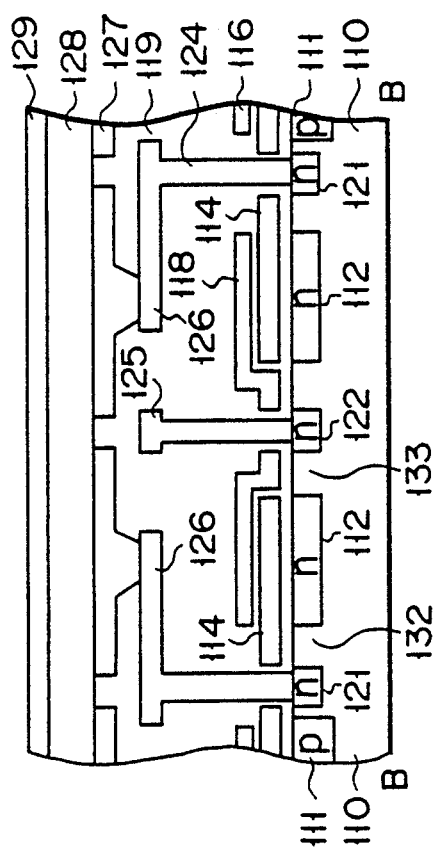
FIG. 12B is a cross section of the solid-state image sensor along the line B—B in FIG. 12A.
Figure 12C:
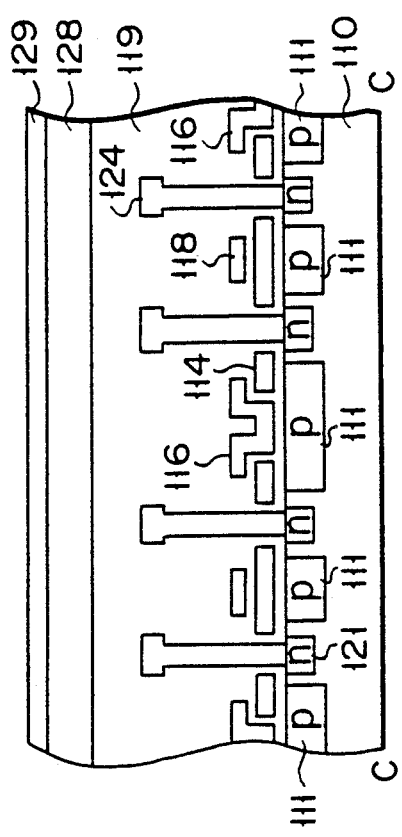
FIG. 12C is a cross section of the solid-state image sensor along the line C—C in FIG. 12A.

Referring to FIGS. 12A to 12C, the arrangement of the image sensor shown in FIG. 11 will be described in detail. As shown in FIG. 12B, the n type region 121 serving as storage diodes and the n type region 122 serving as bias-charge injecting/discharging diodes are formed on the p type silicon substrate 110. n type CCD channels 112 are provided in the vertical direction between the storage diodes 121 and bias-charge injecting-/discharging diodes 122. Above each CCD channel 112 lies a read-out gate 114 for reading out charges from the storage diode 121 on that CCD channel 112. A transfer gate 116 for transferring charges in the vertical direction is provided between the read-out gates 114. Further, bias-charge injecting/discharging gates 118 for injecting and discharging bias charges into and from bias-charge discharging diodes (charge diodes) 122 are provided adjacent to the read-out gates 114. Each read-out gate 114 lies above the CCD channel 112 and extending from one end of the storage diode 121 to one end of the diode 122. As shown in FIG. 12B, a charge read-out region 132 is formed between the CCD channel 112 and storage diode 121, and a bias-charge injecting/discharging region 133 is formed between the CCD channel 112 and the diode 122. As shown in FIG. 12C, a p type region 111 for separating adjacent storage diodes 121 is formed therebetween. Similarly, a p type region 111 for separating n rows of CCD channels 112 from one another is provided therebetween as shown in FIG. 12B.

A pixel electrode 127 is provided on the silicon substrate 110 and gates 114, 116 and 118 via an insulative film 119. This pixel electrode 12 is coupled through lead electrodes 124 to the storage diodes 121. A wiring 125 coupled to the bias-charge injecting/discharging diode 122 is formed between the pixel electrode 127 and the bias-charge injecting/discharging gate 118. A photoconductive film 128 made of amorphous Si or the like is formed on the pixel electrode 127, and a transparent electrode 129 made of ITO or the like is formed on the film 128. A horizontal register 140 is horizontally provided at one end of the vertical registers 130 as shown in FIG. 11. Charges are transferred to the horizontal register 140 from the vertical registers 130, and these charges are detected by a charge detector 141.

The feature of the solid-state image sensor having the above structure lies in that injection and discharging of bias charges are executed by the same diode 122 and gate 118. Further, (2n−1) rows of charge transfer sections and 2n rows of charge transfer sections (n: positive integer) are provided adjacent to both sides of each bias-charge injecting/discharging section 131. In other words, a column of bias-charge injecting/discharging section 131 is provided for two adjacent rows of the charge transfer sections. Also, (2n−1) rows and 2n rows (n: positive integer) of storage diodes are arranged in the vertical direction (C direction). This arrangement reduces the horizontal area.

The injection and discharging of bias charges in the above solid-state image sensor can be done by the same method of the previous embodiments as described earlier with reference to FIGS. 5, 6A–6E, 8 and 9A–9E. In this case, the bias-charge injecting diode 51, bias-charge injecting gate 41, signal charge read-out gate 31 also serving as a transfer electrode and storage diode 11 as shown in FIGS. 6A and 9A respectively correspond to the bias-charge injecting diode 122, bias-charge injecting gate 118, signal charge read-out gate 114 also serving as a transfer electrode and storage diode 121 as shown in FIG. 12B.

Figure 13:
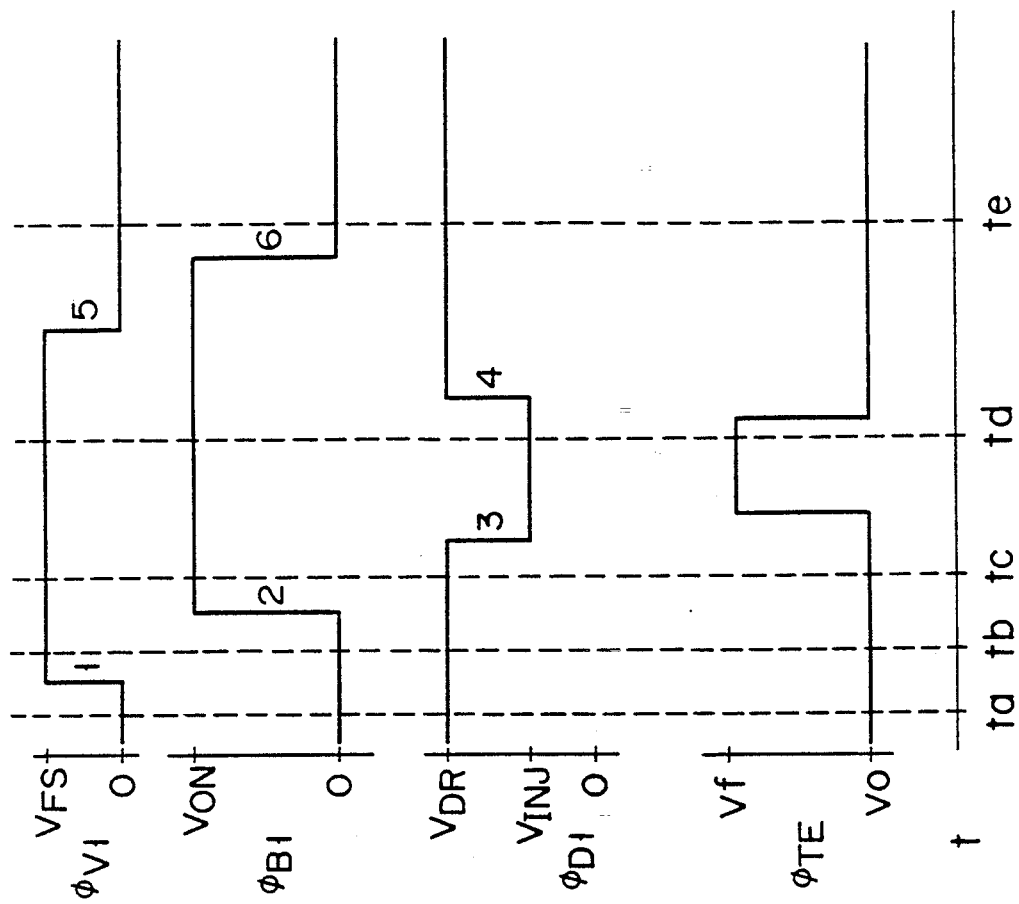
FIG. 13 is a signal waveform diagram illustrating drive pulses to a transfer electrode, a bias-charge injecting gate and a bias-charge injecting diode of the solid-state image sensor shown in FIG. 11.

In the operation illustrated in FIGS. 9A–9E, in a case where the potential to be applied as needed to the diode 122 is $V_{INJ}$ (corresponding to the state as shown in FIG. 9B), if the potential $\phi_{TE}$ of the transparent electrode 129 is controlled to be higher than $V_{INJ}$ as shown in FIG. 13, a potential decreasing from the storage diode 122 to the transparent electrode 129 is generated in the photoconductive film 128, thus ensuring well injection of bias charges in the photoconductive film 128. Accordingly, the capacitive residual image and photoconductive residual image ca be surely eliminated.

A method of producing the solid-state image sensor as shown in FIGS. 1 and 2A–2C will be described below referring to FIGS. 14A to 19C.

First, an impurity of the same conductivity type as that of a p type silicon substrate 110 is ion-injected in the substrate 110 using a predetermined mask to thereby form a p+ region (inversion preventing region) 111 in the substrate 110, as shown in FIGS. 14A to 14C. Further, a band-shaped CCD channel (n type region) 112 is formed in the substrate 110 using a given mask by ion injection or PSG diffusion.

Then, a poly crystalline silicon film 114 is formed on the substrate 110 through a gate oxide film 113 and is made into a predetermined pattern to form a first transfer gate 114 as shown in FIGS. 15A to 15C. At this time, an opening C is formed in the poly crystalline silicon film 114.

Then, a poly crystalline silicon film 116 is formed on the substrate 110 through a gate oxide film 115 and is made into a predetermined pattern to form a second transfer gate 116 as shown in FIGS. 16A to 16C.

Figure 17A:
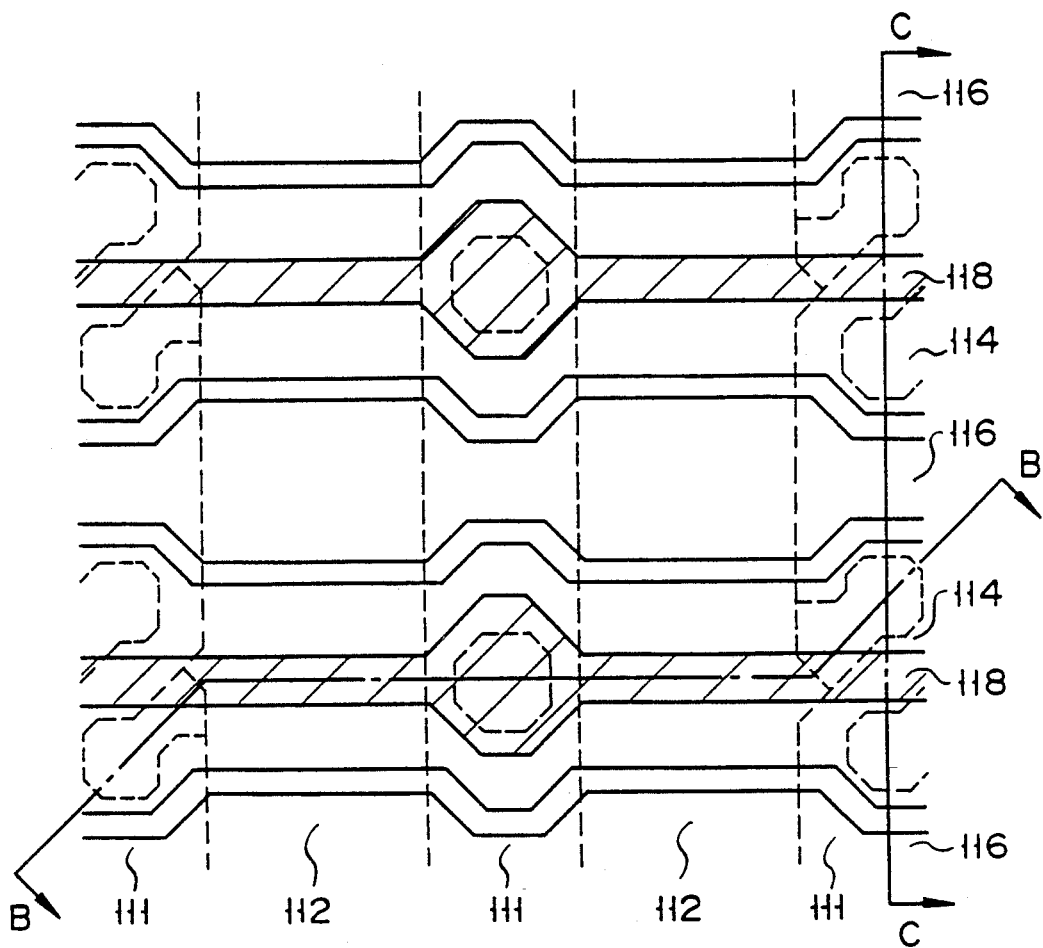
Figure 17B:
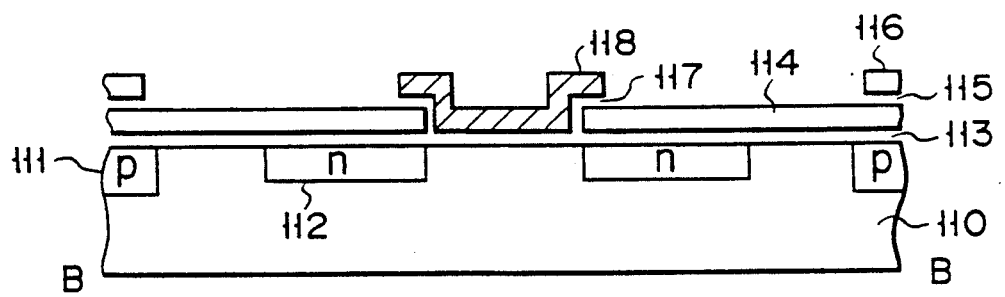
Figure 17C:
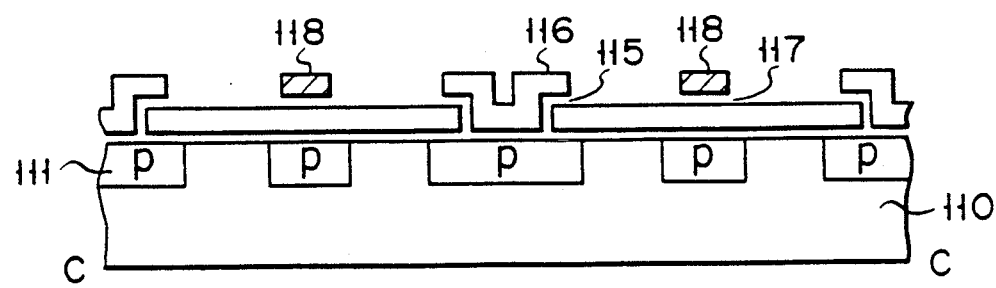

Then, a poly crystalline silicon film 118 is formed on the substrate 110 through a gate oxide film 117 and is made into a predetermined pattern to form a bias-charge injecting/discharging gate 118 as shown in FIGS. 17A to 17C.

Figure 18A:
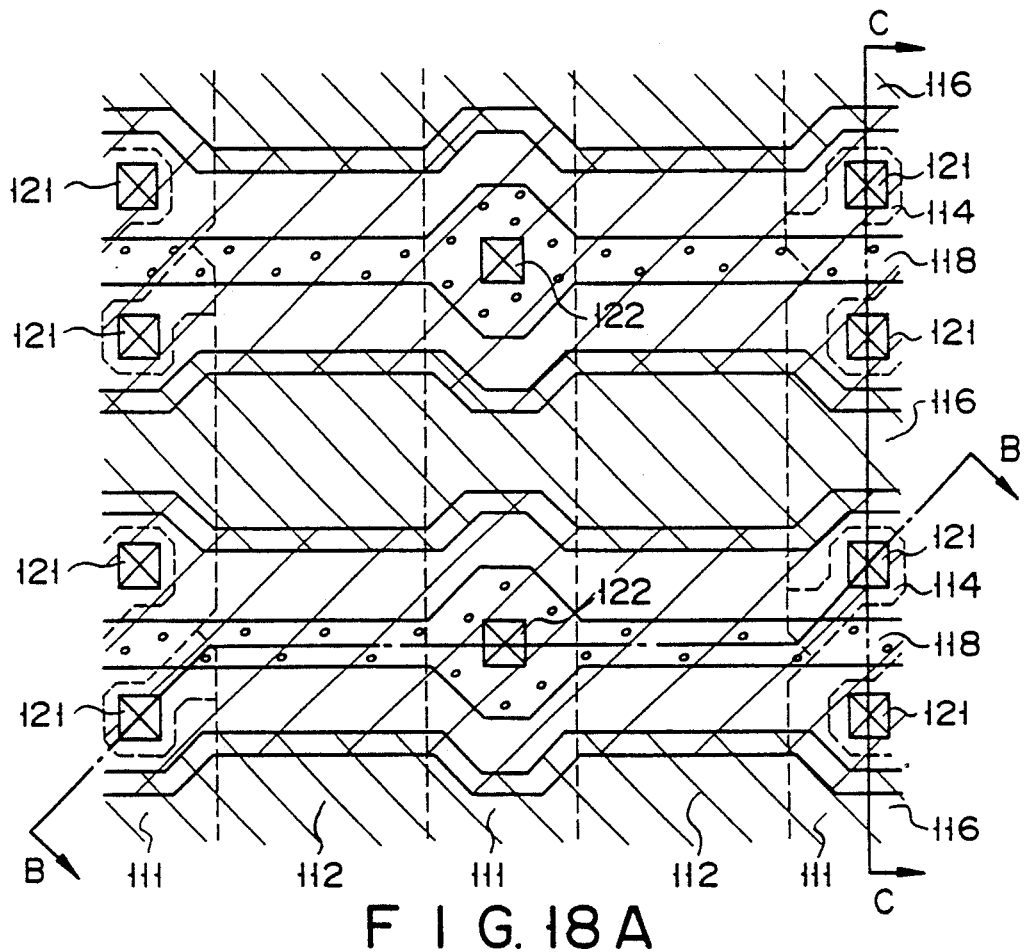
Figure 18B:
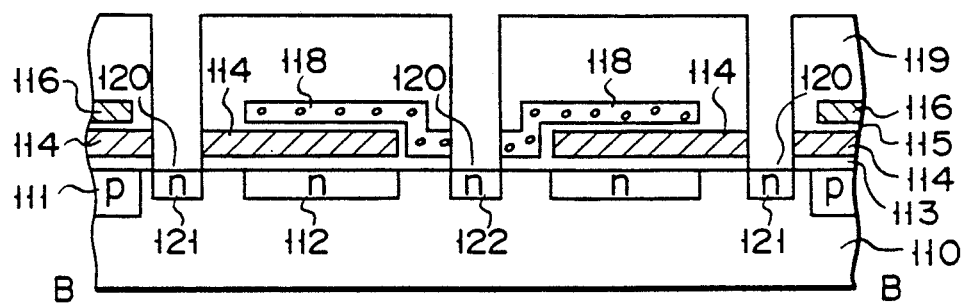
Figure 18C:
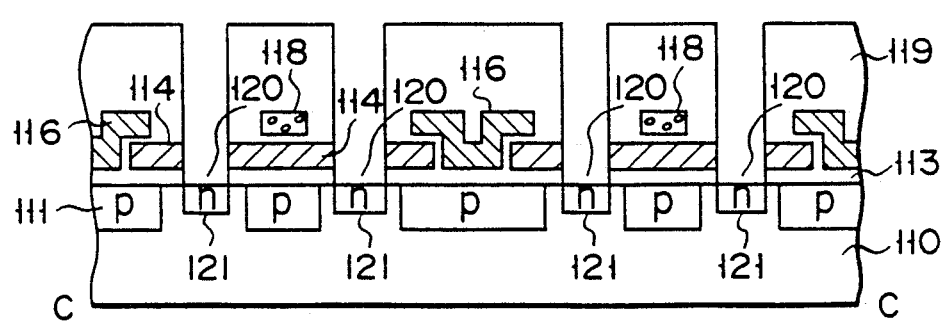

Subsequently, an insulating layer 119 is deposited on the semiconductor structure shown in FIGS. 17A–17C by means of a CVD method, then a contact hole 120 is formed in the storage diode region and bias-charge injecting/discharging diode region, as shown in FIGS. 18A to 18C. An n type region 122 serving as a storage diode is formed via this hole 120 by ion injection or PSG diffusion.

Figure 19A:
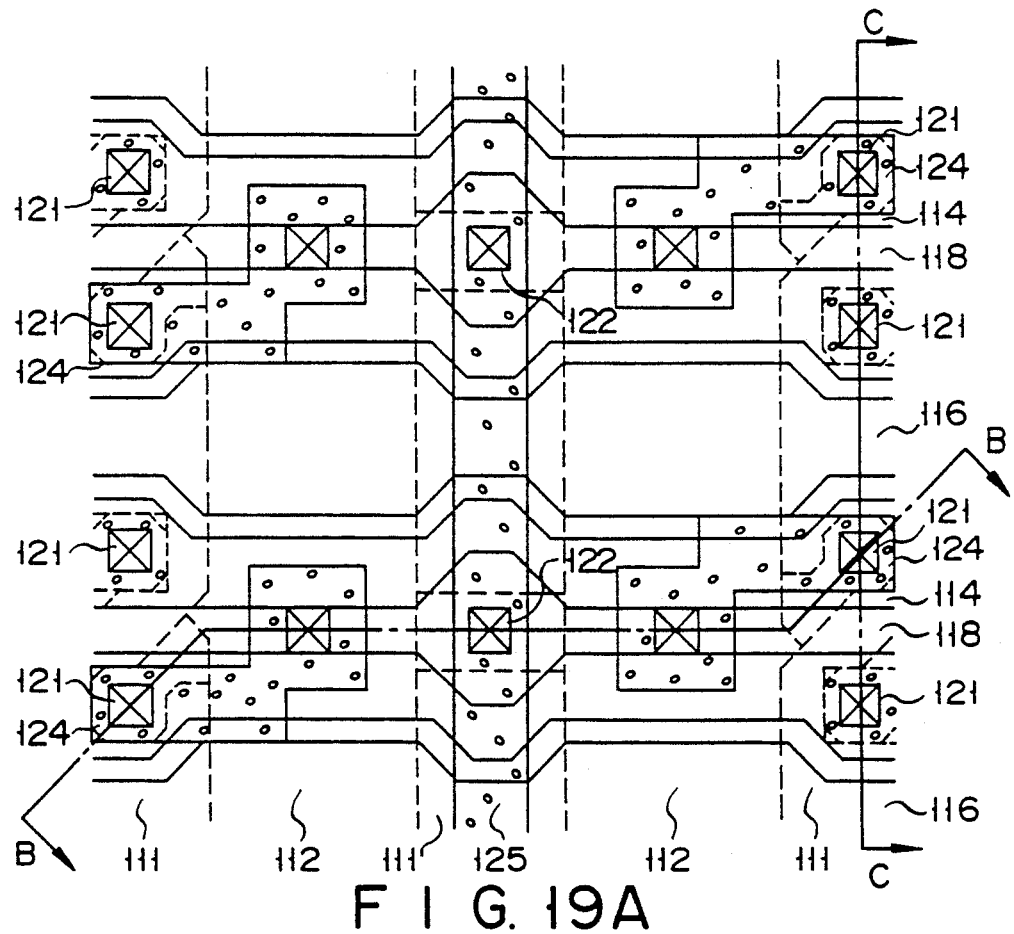
Figure 19B:
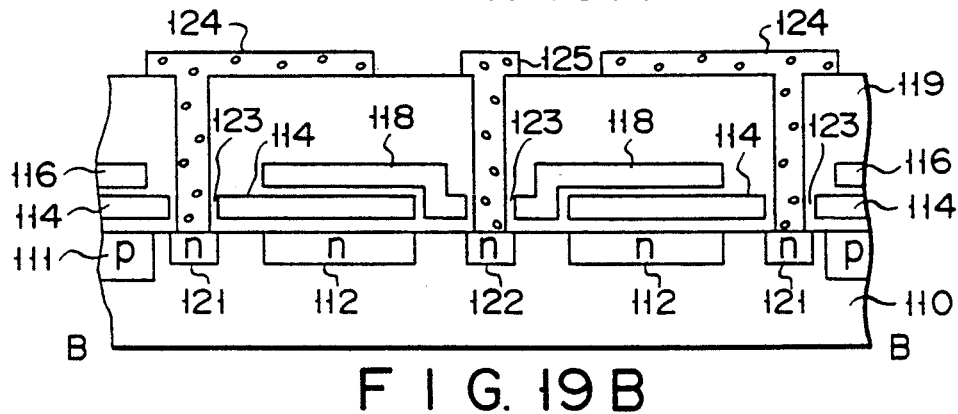
Figure 19C:
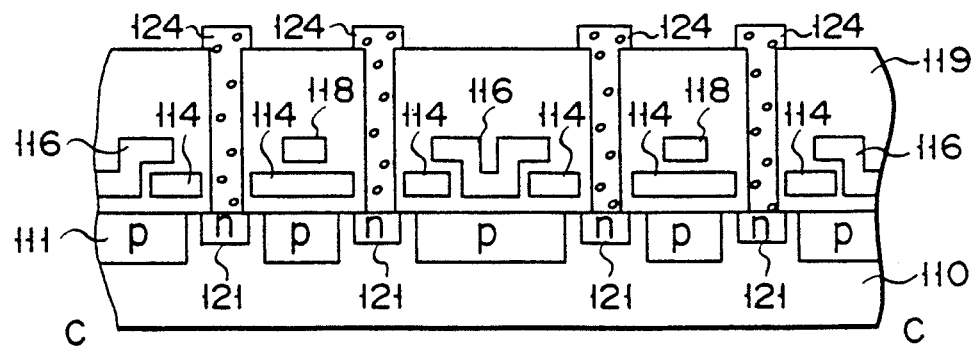

An insulating film 123 is then formed on the side wall of the contact hole 120, then a poly crystalline silicon film or other conductive layer is formed in the hole 120, thereby forming a lead electrode 124 and a wire 125 for the bias-charge injecting/discharging diode (see FIGS. 19A to 19C).

The insulating film 123 is formed as follows. A thermal oxide film, for example, is formed on the substrate 110 through the contact hole 120, a silicon nitride film is deposited on the thermal oxide film, then these films are etched back by reactive ion etching so as to remain on the side wall of the contact hole 120.

Then, a contact hole 126 is formed in the lead electrode 124, and a pixel electrode 127 is formed on the lead electrode 124 through this contact hole, as shown in FIGS. 12A to 12C. A photoconductive film 128 made of amorphous silicon or the like is deposited on the pixel electrode 127, and a transparent electrode 129 made of ITO or the like on the photoconductive film 128.

With the above structure, the signal read-out gate 114 and the lead electrode 124 or the bias-charge injecting-/discharging gate 118 and its wire 125 can be formed by self-alignment without considering their misalignment or conversion difference. It is therefore possible to reduce the areas of the storage diode 121 and bias-charge injecting/discharging diode 122. Further, the provision of the diodes 121 and 122 can surely reduce a residual image. Furthermore, as the bias charges temporarily injected ar discharged to the bias-charge injecting/discharging diode 122 via the read-out gate 114, the value of the dark current does not depend on the quantity of the bias charges above a specific amount, thus ensuring uniform injection of bias charges.

In the above embodiment, the storage diode 121 and bias-charge injecting/discharging diode 122 can be formed from the lead electrode 124 and wire 125 by impurity diffusion.

The storage diodes may be arranged in a row instead of in a matrix form. In this case, the vertical registers need not be separated from the horizontal register and a single charge transfer part should only be provided along the row of the storage diodes.

A description will now be given of a method of injecting bias charges by changing the potential of the transparent electrode in the solid-state image sensor shown in FIGS. 1 and 2, with reference to the timing chart given in FIG. 20. Although the following description explains how to inject bias charges into the photoconductive film 84 via the storage diode 11, the same method ca apply to injecting bias charges in the photoconductive film 84 via the storage diode 12.

Figure 20:
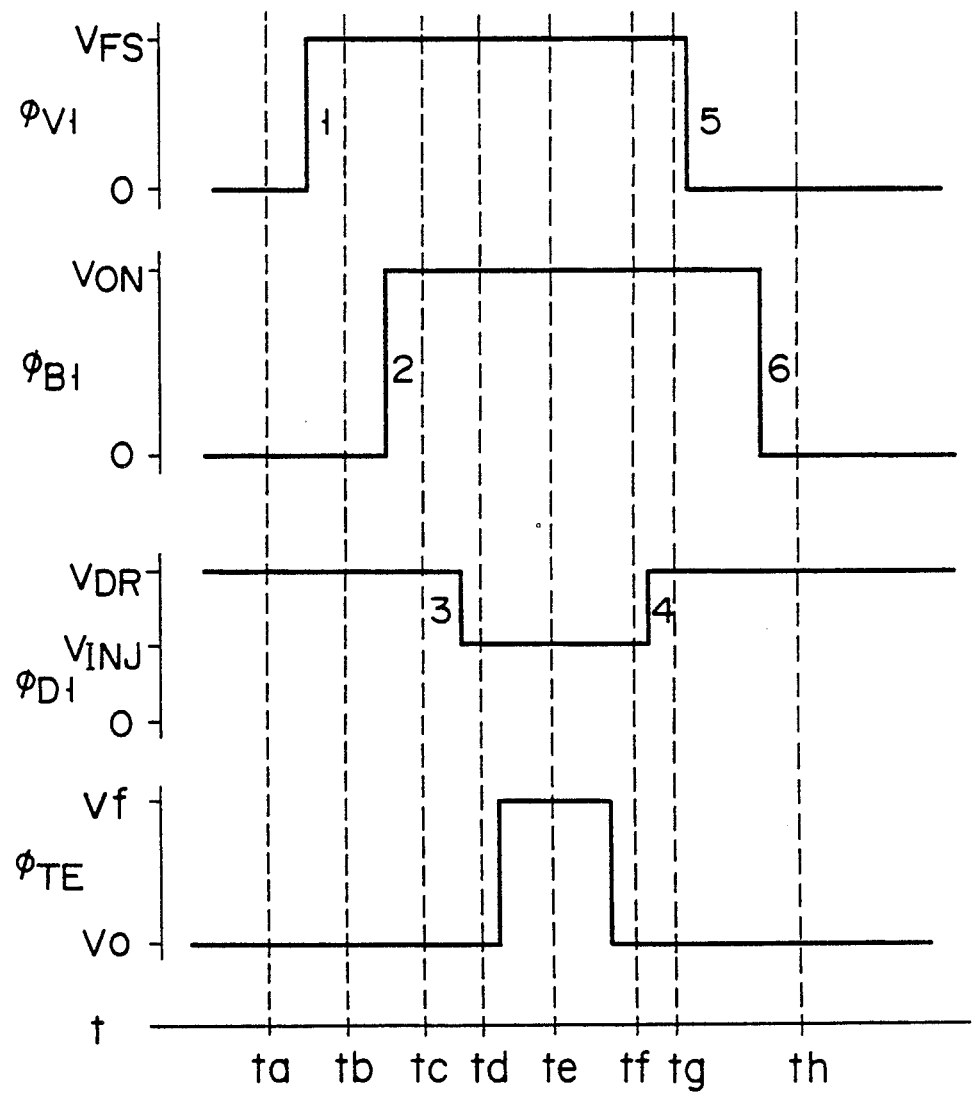
FIG. 20 is a timing chart of drive pulses for driving the solid-state image sensor shown in FIG. 1 by another driving method that changes the potential of a transparent electrode.

FIG. 20 illustrates the drive pulses $\phi_{V1}$, $\phi_{B1}$, $\phi_{D1}$ and $\phi_{TE}$ to the transfer electrode 21, bias-charge injecting gate 41, bias-charge injecting diode 51 and transparent electrode 85, and FIGS. 21A to 21I illustrate a schematic cross section of the solid-state image sensor along the line B—B in FIG. 2A and a change in potential state in the sensor. Numerals "1" to "6" given in FIG. 20 are timings corresponding to those given in FIGS. 21B–21I. And "ta" and "te" in FIG. 20 respectively correspond to "t4" and "t5" in FIG. 3.

When the same voltage $V_{FS}$ as given for reading out signal charges is applied to the transfer electrode 21 during an interval between $t_a$ and $t_b$ as shown in FIG. 20, the read-out gate 31 is rendered ON as shown in FIG. 21B. When a voltage $V_{ON}$ is applied to the bias-charge injecting gate 41 between $t_b$ and $t_c$, this gate 41 is opened as shown in FIG. 21C. When the voltage to be applied to the bias-charge injecting diode 51 changes to $V_{INJ}$ from $V_{DR}$ during an interval between $t_c$ and $t_d$, the bias charges are injected into the storage diode 11 via the bias-charge injecting gate 41 and read-out gate 31, as shown in FIG. 21D.

When the voltage to be applied to the transparent electrode 85 changes to $V_f$ from $V_0$ during an interval between $t_d$ and $t_e$, the bias charges are injected into the photoconductive film 84 via the storage diode 11 as shown in FIG. 21E. Part of the bias charges injected into the photoconductive film 84 fills in the trap level which is a cause of a photoconductive residual image. When the voltage to be applied to the transparent electrode 85 changes to $V_0$ from $V_f$ between times $t_e$ and $t_f$, excess portion of the bias charges which does not fill in the trap level is discharged to the side of the storage diode 11, as shown in FIG. 21F.

When the voltage to be applied to the bias-charge injecting diode 51 changes to $V_{DR}$ from $V_{INJ}$ during an interval between $t_f$ to $t_g$, the bias charges in the drive pulse 11 are also discharged to this diode 51 as shown in FIG. 21G. When the voltage to be applied to the transfer electrode 21 changes to 0 from $V_{FS}$, the read-out gate is rendered OFF as shown in FIG. 21H. Finally, the voltage of the bias-charge injecting gate 41 becomes 0 V to thereby close this gate 41, as shown in FIG. 21I. This completes a sequence of bias-charge injecting operations.

According to the above embodiment, since the gate 40 and diode 50 ar provided to electrically inject and discharge bias charges into and from the signal charge storage diode 10, bias charges can be injected into the storage diode 50 without requiring any light source. This permits bias charges enough to sufficiently reduce a capacitive lag to be uniformly injected into the storage diode 50, so that this method is significantly effective in reducing a residual image.

Further, since bias charges are electrically injected into the photoconductive film 84 via the storage diode 50 by changing the voltage to be applied to the transparent electrode 85, it is possible to inject a sufficient amount of bias charges to reduce a photoconductive lag. Furthermore, in addition to signal charges, an excess amount of the injected bias charges is discharged to the bias-charge injecting diode 51 via the storage diode 50, so that the dynamic range is not reduced.

In the above operation, the voltage to be applied to the transparent electrode has only to be changed in such a way that the bias charges can be injected into or discharged from the photoconductive film while the potential of the storage diode is determined by the potential of the bias-charge injecting diode. Further, the voltage to be applied to the transparent electrode may be changed in such a way as to increase the magnetic field going from the transparent electrode toward the storage diode in order to improve the efficiency of discharging the excess amount of bias charges, as long as the voltage applied to the transparent electrode is returned to the level provided at the time of storing signal charges while the potential of the storage diode is determined by the potential of the bias-charge injecting diode.

According to the above embodiment, providing the gate and diode for injection and discharging of bias charges can permit the bias charges to be electrically injected into and discharged from the storage diode. It is therefore possible to uniformly inject bias charges into the signal charge storage diode without requiring a light source, thus improving the residual image characteristic. In addition, the bias charges can be electrically injected into and discharged from the photoconductive film, so that a sufficient amount of bias charges to reduce the photoconductive lag can be injected and an excess amount of the bias charges can be discharged, thus suppressing the reduction of the dynamic range.

According to another embodiment shown in FIG. 22, a plurality of signal charge storage diodes 10 are arranged in matrix on an Si substrate and transfer electrodes of a vertical CCD are provided in columns and adjacent to the storage diodes 10. These transfer electrodes are applied with drive pulses $\phi_{V1}$, $\phi_{V2}$, $\phi_{V3}$ and $\phi_{V4}$, and the vertical CCD is of a 4-phase driven type. Those electrodes 20 to which the drive pulses $\phi_{V1}$ and $\phi_{V3}$ also serve as signal charge read-out gates 30.

This solid-state image sensor has charge injecting gates 40, charge injecting diodes 50, bias-charge discharging gates 240 and diodes 50. The bias-charge discharging gates 240 and diodes 50' are provided opposite the storage diodes 10 of the vertical CCD, and the bias-charge injecting gates 40 and diodes 50 are disposed neighboring the storage diodes 10. Drive pulses $\phi_{B1}$ and $\phi_{B2}$ are applied to the gates 40, drive pulse $\phi_{C1}$ and $\phi_{C2}$ to the gates 240, and drive pulses $\phi_{D1}$ and $\phi_{D2}$ to the diodes 50. As a result, the bias charges are injected from the diodes 50 through the gates 40, and the stored bias charges are discharged from the storage diodes 10 to the diodes 50 through the read-out gates 30, vertical CCD and gates 240.

Referring to the plan view of the solid-state image sensor in FIG. 23A, of the transfer electrodes 20, those electrodes 21, 23 to which the drive pulses $\phi_{V1}$ and $\phi_{V3}$ are applied constitute a first poly Si layer, whereas those electrodes 22, 24 applied with the drive pulses $\phi_{V2}$ and $\phi_{V4}$ constitute a second poly Si layer. The gates 40 constitute a third poly Si layer. A plurality of vertical CCD channels 60 are vertically provided. An electrode 51 is coupled to the diodes 50'. The storage diodes 10 each has a diode 11 adjacent to the transfer electrode 21 and a diode 12 adjacent to the transfer electrode 23. Similarly, each read-out gate 30, each bias-charge injecting gate 40, each bias-charge discharging gate 240, each diode 50 and each bias-charge injecting electrode 70 respectively have a signal charge read-out gate 31, a bias-charge injecting gate 41, a bias-charge discharging gate 241, a diode 51 and a bias-charge injecting electrode 71 with respect to the storage diode 11, and respectively have a signal charge read-out gate 32, a bias-charge injecting gate 42, a bias-charge discharging gate 242, a diode 52 and a bias-charge injecting electrode 72 with respect to the storage diode 12.

As shown in FIGS. 23B and 23C, the n type CCD channel region 60 is formed on a p type substrate 81. The transfer electrodes 21 to 24 are sequentially formed on the channel region 60 along this region. The diode region 11 is formed adjacent to the channel region 60, and a pixel electrode wire 82 is coupled to this diode region 11. The diode region 51 is formed on one side of the channel region 60 opposite the diode region 11. The bias-charge injecting electrode 71 is coupled to this diode region 51. The bias-charge injecting gate electrodes 41 and 42 and the bias-charge discharging gates 241 and 242 are insulatively formed on the substrate 81 between the diode region 51 and the channel region 60 and between the diode region 51 and the storage diode 11. The gate electrode 41 is extending above the area between the transfer electrodes 21 and 24, and the gate electrode 42 above the are between the transfer electrodes 22 and 23. The bias-charge injecting electrodes 71 and 72 are extending above the transfer electrodes through insulating layers. The pixel electrode wire 82 is coupled to a pixel electrode 83.

A photoconductive film 84 is formed on the entire top surface of the above semiconductor structure, and a transparent electrode 85 is formed on the entire top surface of this photoconductive film 84.

The operation of the image sensor shown in FIGS. 22 to 23C will be described in conjunction with timing charts shown in FIG. 3 and FIGS. 4A to 4L.

As shown in FIG. 3, when the voltage $\phi_{V1}$ of the read-out gate 31 becomes a voltage $V_{FS}$ between times $t_0$ and $t_1$, signal charges are read out from the storage diode 11 onto a channel under the transfer electrode 21 as shown in FIGS. 4A to 4C. When the drive pulses $\phi_{V1} - \phi_{V4}$ of the individual transfer electrodes 20 change as shown in FIG. 3 during an interval between times $t_1$ and $t_4$, the signal charges are transferred onto a channel under the transfer electrode 23 as shown in FIGS. 4C to 4E. Between times $t_4$ and $t_5$, bias charges are injected in the storage diode 11 and discharged therefrom by the present method. The injection and discharge of the bias charges will be described later.

When the voltage $\phi_{V3}$ of the read-out gate 32 becomes a voltage $V_{FS}$ between times $t_5$ and $t_7$, signal charges are read out from the storage diode 12 and the signal charges are added with those in the storage diode 11 in a channel under the transfer electrode 23, as shown in FIGS. 4E to 4G. When the drive pulses $\phi_{V1}-\phi_{V4}$ of the individual transfer electrodes 20 change as shown in FIG. 3 during an interval between times $t_7$ and $t_{10}$, the signal charges are transferred onto a channel under the next transfer electrode 21 as shown in FIGS. 4G to 4J. Between times $t_{10}$ to $t_{11}$, bias charges are injected in the storage diode 12. The above-described transferring of the signal charges is the same as is done in the conventional interlaced scanning system ((field storage mode).

The following will describe how to inject bias charges. Although the description of the injection of bias charges will be given with reference to the storage diode 11, the same method can apply to injecting bias charges in the storage diode 12.

FIG. 24 illustrates the drive pulses $\phi_{V1}$, $\phi_{B1}$, $\phi_{C1}$ and $\phi_{D1}$ to the transfer electrode 21, bias-charge injecting gate 41, bias-charge discharging gate 241 and diode 51, and FIGS. 25A to 25E illustrate a schematic cross section of the solid-state image sensor along the line B—B in FIG. 2A and changes in potential state in the sensor. Numerals "1" to "6" given in FIG. 24 are timings corresponding to those given in FIGS. 6B to 6E. "ta" and "tf" in FIG. 24 respectively correspond to "$t_4$" and "$t_5$" in FIG. 3.

Figure 25A:
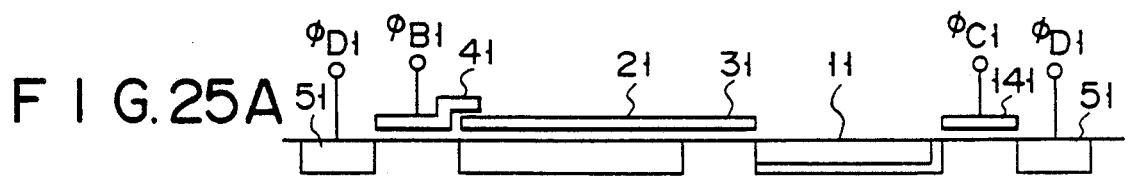
FIGS. 25A through 25E are diagrams illustrating a schematic cross section of the solid-state image sensor along the line B—B in FIG. 23A and changes in potential state of the image sensor.
Figure 25B:
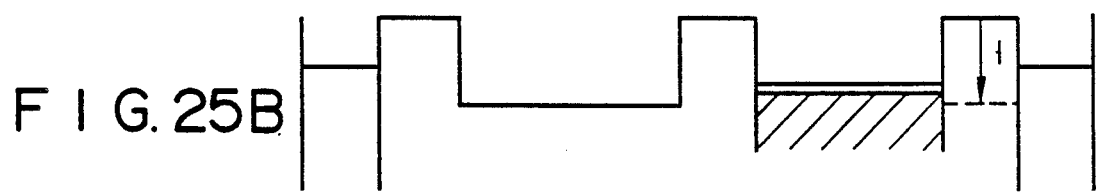
Figure 25C:
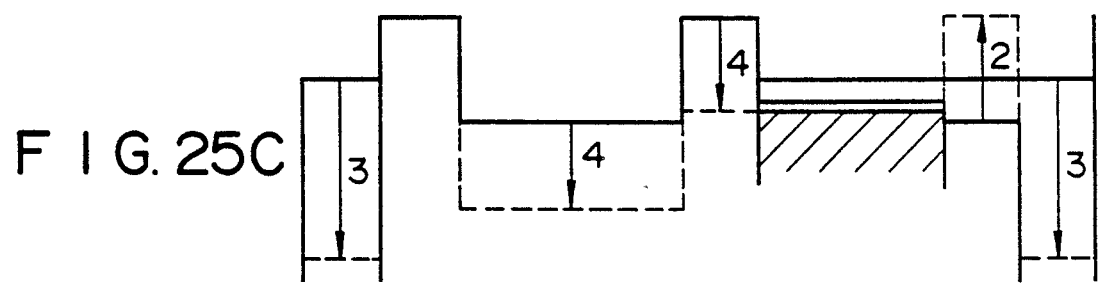
Figure 25D:
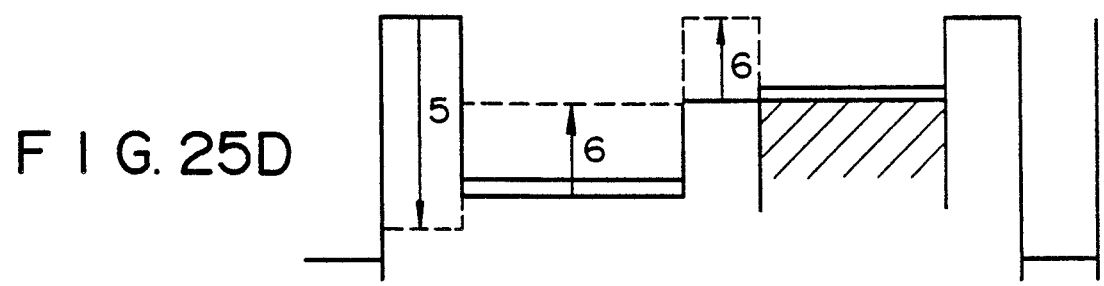
Figure 25E:
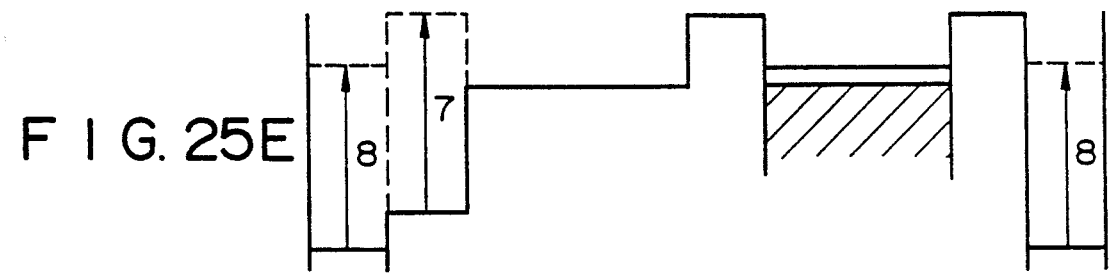

When the voltage $V_{ON}$ is applied to the bias-charge injecting gate 241 between ta and tb as shown in FIG. 24, the gate 241 shown in FIG. 25A is opened. Then, a bias-charge injecting voltage $V_{INJ}$ is applied to the diode 51, this diode operates as a bias-charge injecting diode, and injects the bias charges into the storage diode 11 through the bias-charge injecting gate 241. When voltage applied to the bias-charge injecting gate 241 is varied from VON to $V_{OFF}$ between tb and tf, the gate 241 is closed as shown in FIG. 25B, whereby the injection operation of the bias-charges is completed. In this time, the voltage applied to the diode 51 is changed from $V_{INJ}$ to $V_{DR}$, so that the diode 51 becomes to be operable as a bias-charge discharging diode. Between tc and td, when the same voltage $V_{FS}$ as that in the signal charge read-out operation is applied to the transfer electrode 21, the signal charge read-out gate 31 is rendered ON, so that the bias-charges are discharged from the storage diode 11 from the vertical CCD. In this state, when the voltage $V_{ON}$ is applied to the bias-charge gate 241, this gate 241 is opened as shown in FIG. 25D, so that the bias-charges are discharged from the vertical CCD to the diode 51.

When the voltage applied to the transfer electrode 21 is changed from VFS to 0V between td and te, the signal charge read-out gate 31 is rendered OFF. In a last period between the times te and tf, the voltage applied to the bias-charge discharging gate 241 is varied from $V_{ON}$ to O, so that the voltage applied to the diode 51 is changed from $V_{RD}$ to $V_{INJ}$, to close the bias-charge discharging gate 241. As a result, the diode 51 becomes to be operable as the bias-charge injecting diode, and a sequence of bias-charge injecting and discharging operations is completed.

In the embodiment shown in FIGS. 22–25E, the diode 50 is used in common for both the charge injecting and discharging, if respective diodes are independently provided for charge injecting and discharging, the bias-charge injecting diode is applied with the voltage $V_{INJ}$, and the bias-charge discharging diode with the voltage $V_{DR}$, and the other elements are operated similarly to the above embodiment.

What is claimed is:

1. A solid-state image sensor comprising:
   a semiconductor substrate;
   a plurality of arrays of signal charge storage diodes formed in said semiconductor substrate;
   a plurality of signal charge read-out sections formed neighboring to said arrays of the signal charge storage diodes, in said semiconductor substrate;
   a plurality of signal charge transfer sections formed neighboring said signal charge read-out sections in said semiconductor substrate; and
   a plurality of bias-charge injecting gates and diodes, provided neighboring to said signal charge transfer sections, for injecting bias charges into said signal charge storage diodes via said signal charge read-out sections;
   wherein plural pixel electrodes and said signal charge storage diodes are arranged in a matrix form, said signal charge transfer sections comprise a plurality of signal charge transfer arrays arranged in a row along said arranged signal charge storage diodes, said bias-charge injecting gates and diodes are provided in association with said signal charge storage diodes, and after the signal charges are read out from said signal charge storage diodes, said bias charges are injected into all of said signal charge strange diodes for every other row of said signal charge storage diodes.

2. A solid-state image sensor according to claim 1, wherein each of said signal charge read-out sections and each of said signal charge transfer sections are, respectively, constituted by a read-out electrode and a transfer electrode integrally formed.

3. A solid-state image sensor according to claim 1, wherein said bias-charge injecting gates and diodes are provided neighboring said signal charge transfer sections on an opposite side to said signal charge storage diodes.

4. A solid-state image sensor comprising:
   a semiconductor substrate;
   a plurality of signal charge storage diodes formed in said semiconductor substrate;
   a plurality of signal charge read-out sections formed neighboring said signal charge storage diodes in said semiconductor substrate;
   a plurality of signal charge transfer sections formed neighboring said signal charge read-out sections in said semiconductor substrate; and
   a plurality of bias-charge injecting/discharging gates and diodes, providing neighboring said signal charge transfer sections, for injecting bias charges into said signal charge storage diodes via said signal charge read-out sections and discharging, via said signal charge read-out sections, said bias charges injected into said signal charge storage diodes;
   wherein said pixel electrodes and said signal charge storage diodes are arranged in a matrix form, said signal charge transfer sections comprise a plurality of signal charge transfer arrays sections comprise a plurality of signal charge transfer arrays arranged in a row along said arranged signal charge storage diodes, said bias-charge injecting/discharging gates and diodes are provided in association with said signal charge storage diodes, and after signal charges are read out from said signal charge storage diodes, said bias charges are injected into all of said signal charge storage diodes for every other row of said signal charge storage diodes.

5. A solid-state image sensor according to claim 4, wherein each of said signal charge read-out sections and each of said signal charge transfer sections are respectively constituted by a read-out electrode and a transfer electrode integrally formed.

6. A solid-state image sensor according to claim 4, wherein said bias-charge injecting/discharging gates and diodes are provided neighboring said signal charge transfer sections on an opposite side to said storage diodes.

7. A solid-state image sensor comprising:
a semiconductor substrate;
a plurality of pixel elements including a plurality of storage diodes arranged on said semiconductor substrate;
a plurality of charge transfer sections provided neighboring said storage diodes;
a plurality of signal read-out sections for reading out signal charges stored in said storage diodes, to said charge transfer sections; and
a plurality of bias-charge injecting/discharging gates and diodes, commonly provided for those of said pixel elements which are horizontally adjacent to each other, for injecting bias charges into said storage diodes via said plurality of charge read-out sections and discharging said bias charges from said storage diodes via said plurality of charge read-out sections;
wherein said charge transfer sections have a plurality of channel regions formed in said semiconductor substrate and said storage diodes are arranged between those of said channel regions which neighbor each other.

8. A solid-state image sensor according to claim 7, wherein said storage diodes are arranged in a matrix form on said semiconductor substrate, said charge transfer sections comprise a plurality of vertical registers vertically arranged neighboring said storage diodes, and said bias-charge injecting/discharging diodes are formed vertically neighboring said vertical registers.

9. A solid-state image sensor comprising:
a semiconductor substrate;
a plurality of pixel elements including a plurality of storage diodes arranged on said semiconductor substrate;
a plurality of charge transfer sections provided neighboring said storage diodes;
a plurality of signal charge read-out sections for reading out signal charges stored in said storage diodes, to said charge transfer sections; and
a plurality of bias-charge injecting/discharging gates and diodes, commonly provided for those of said pixel elements which are horizontally adjacent to each other, for injecting bias charges into said storage diodes and discharging said bias charges from said storage diodes;
wherein said bias-charge injecting/discharging diodes are arranged in a plurality of rows and adjacent two of said charge transfer sections are arranged on both sides of each row of said storage diodes.

10. A solid-state image sensor comprising:
a solid-state image sensing element chip having a semiconductor substrate, a plurality signal charge storage diodes formed on said semiconductor substrate, a plurality of signal charge read-out sections formed neighboring said storage diodes on said signal charge semiconductor substrate, a plurality of signal charge transfer sections formed neighboring said signal charge read-out sections on said semiconductor substrate, a plurality of pixel electrodes electrically coupled to said signal charge storage diodes, and a plurality of bias-charge injecting discharging means for injecting and discharging bias charges into and from said signal charge storage diodes via said signal charge read-out sections;
a photoconductive film deposited on said solid-state image sensing element chip;
a transparent electrode formed on said photoconductive film; and
means for changing a voltage to be applied to said transparent electrode in accordance with injecting and discharging of said bias charges.

11. A solid-state image sensor according to claim 10, wherein said voltage changing means comprises means for changing said voltage to be applied to said transparent electrode from a voltage attained during a signal charge storing period, in order to inject said bias charges into said photoconductive film from said signal charge storage diodes, and returning said voltage applied to said transparent electrode to said voltage attained during said signal charge storing period, in order to discharge an excess amount of bias charges stored in said photoconductive film to said signal charge storage diodes.

12. A solid-state image sensor according to claim 10, wherein said charge injecting/discharging means are provided neighboring said signal storage diodes, and each include a couple of gate and diode for injecting the bias charges into said storage diodes and a couple of gate and diode for discharging the bias charges injected into said storage diodes to said charge read-out sections.

13. A solid-state image sensor comprising:
a semiconductor substrate;
a plurality of arrays of signal charge storage diodes formed on said semiconductor substrate;
a plurality of signal charge read-out sections provided neighboring said array of signal charge storage diodes on said semiconductor substrate;
a plurality of signal charge transfer sections provided neighboring said signal charge read-out sections on said semiconductor substrate;
a plurality of charge injecting gates and diodes disposed neighboring said signal charge storage diodes, for injecting bias charges into said signal charge storage diodes; and
a plurality of bias-charge discharging gates and diodes provided neighboring said charge read-out sections, for discharging the bias charges injected into said storage diodes via said charge read-out sections;
wherein said signal charge storage diodes are arranged in a matrix form, said signal charge transfer sections comprise a plurality of signal charge transfer arrays arranged in a row along said arranged signal charge storage diodes, said bias-charge injecting gates and diodes are provided in association with said signal charge storage diodes, and after the signal charges are read out from said signal charge storage diodes, the bias charges are injected into all of said signal charge storage diodes for every other row of said signal charge storage diodes.

14. A solid-state image sensor according to claim 13, wherein each of said signal charge read-out sections and each of said signal transfer sections include, respectively, a read-out electrode and a transfer electrode which are integrally formed.

15. A solid-state image sensor according to claim 13, wherein said bias-charge discharging gates and diodes are provided neighboring said signal charge transfer sections on an opposite side to said storage diodes.

* * * * *